(12) United States Patent
Yoshioka

(10) Patent No.: US 11,411,549 B2
(45) Date of Patent: Aug. 9, 2022

(54) CRYSTAL RESONATOR PLATE AND CRYSTAL RESONATOR DEVICE

(71) Applicant: Daishinku Corporation, Kakogawa (JP)

(72) Inventor: Hiroki Yoshioka, Kakogawa (JP)

(73) Assignee: Daishinku Corporation, Kakogawa (JP)

( * ) Notice: Subject to any disclaimer, the term of this patent is extended or adjusted under 35 U.S.C. 154(b) by 418 days.

(21) Appl. No.: 16/618,113

(22) PCT Filed: Jun. 4, 2018

(86) PCT No.: PCT/JP2018/021406
§ 371 (c)(1),
(2) Date: Nov. 28, 2019

(87) PCT Pub. No.: WO2018/235582
PCT Pub. Date: Dec. 27, 2018

(65) Prior Publication Data
US 2020/0144987 A1    May 7, 2020

(30) Foreign Application Priority Data

Jun. 22, 2017   (JP) .............................. JP2017-122550
Jun. 28, 2017   (JP) .............................. JP2017-126147

(51) Int. Cl.
*H03H 9/19* (2006.01)
*H03H 9/05* (2006.01)

(52) U.S. Cl.
CPC ............ *H03H 9/19* (2013.01); *H03H 9/0595* (2013.01)

(58) Field of Classification Search
CPC ................................ H03H 9/19; H03H 9/0595
See application file for complete search history.

(56) References Cited

U.S. PATENT DOCUMENTS

| 8,541,928 B2 * | 9/2013 | Shimao | ................ | H03H 9/1021 310/344 |
| 2013/0043960 A1 * | 2/2013 | Ishii | ..................... | H03H 9/0542 29/25.35 |
| 2013/0106247 A1 * | 5/2013 | Ariji | ..................... | H03H 9/177 310/348 |

(Continued)

FOREIGN PATENT DOCUMENTS

| JP | 2014-068098 A | 4/2014 | |
| WO | WO2016/121182 A1 | 8/2016 | |
| WO | WO-2016121182 A1 * | 8/2016 | ............... H03H 9/02 |

*Primary Examiner* — J. San Martin
(74) *Attorney, Agent, or Firm* — Metrolex IP Law Group, PLLC

(57) ABSTRACT

In a crystal resonator plate (2), a support part (24) extends from only one corner part positioned in the +X direction and in the −Z' direction of a vibrating part (22) to an external frame part (23) in the −Z' direction. The vibrating part (22) and at least part of the support part (24) form an etching region (Eg) having a thickness thinner than a thickness of the external frame part (23). A stepped part is formed at a boundary of the etching region (Eg), and a first lead-out wiring (223) is formed over the support part (24) to the external frame part (23) so as to overlap with the stepped part. At least part of the stepped part that is superimposed on the first lead-out wiring (223) is formed so as not to be parallel to the X axis in plan view.

16 Claims, 17 Drawing Sheets

(56) References Cited

U.S. PATENT DOCUMENTS

| | | | |
|---|---|---|---|
| 2013/0193807 A1* | 8/2013 | Mizusawa | H03H 9/171 310/351 |
| 2014/0203689 A1* | 7/2014 | Obata | H03H 9/19 310/365 |
| 2015/0035410 A1* | 2/2015 | Mizusawa | H03H 9/17 29/25.35 |
| 2018/0006630 A1* | 1/2018 | Kojo | H03H 9/17 |

* cited by examiner (a)

(b) (On first main surface side)

(c) (On first main surface side)

(d) (On second main surface side)

(a)

(b)

(a)

(b)

(c)

(a)

(b)

CRYSTAL RESONATOR PLATE AND CRYSTAL RESONATOR DEVICE

TECHNICAL FIELD

The present invention relates to a crystal resonator plate made of an AT-cut crystal plate in which the following are integrally formed: a vibrating part on which excitation electrodes are formed; an external frame part disposed so as to surround the vibrating part; and a support part connecting and supporting the vibrating part to the external frame part. The present invention also relates to a crystal resonator device including the crystal resonator plate.

BACKGROUND ART

Recently, in various electronic devices, the operating frequencies have increased and the package sizes (especially the heights) have been decreased. According to such an increase in operating frequency and a reduction in package size, there is also a need for crystal resonator devices (such as a crystal resonator and a crystal oscillator) to be adaptable to the increase in operating frequency and the reduction in package size.

Crystal resonator devices having a so-called sandwich structure are known as the crystal resonator devices suitable for reduction in size and height. In the crystal resonator device having a sandwich structure, the housing is formed by a package having a substantially rectangular parallelepiped shape. The package is constituted of: a first sealing member and a second sealing member both made of, for example, glass or crystal; and a crystal resonator plate on respective main surfaces thereof excitation electrodes are formed. The first sealing member and the second sealing member are laminated and bonded via the crystal resonator plate. Thus, a vibrating part of the crystal resonator plate that is disposed in the package (in the internal space) are hermetically sealed by the first sealing member and the second sealing member.

The crystal resonator plate used in the crystal resonator device having the sandwich structure is a crystal plate in which the following are integrally formed: a vibrating part on which the excitation electrodes are formed; an external frame part disposed so as to surround the vibrating part; and a support part connecting and supporting the vibrating part to the external frame part. As the crystal resonator plate, an AT-cut crystal plate is the most widely used since it can be easily processed and also has excellent frequency temperature characteristics.

The crystal resonator plate in which the vibrating part, the external frame part and the support part are integrally formed tends to have a problem that piezoelectric vibration generated by the vibrating part is likely to leak to the external frame part via the support part. In order to address this problem, Patent Document 1 discloses a crystal resonator plate that prevents the leakage of the vibration.

Specifically, Patent Document 1 discloses a configuration in which a support part is protruded from a vibrating part in a Z' axis direction of an AT-cut crystal. Here, the crystal axes of a synthetic quartz crystal are defined as an X axis, a Y axis and a Z axis. Also, the Y axis and the Z axis of the AT-cut crystal when tilted by 35° 15' about the X axis are respectively defined as a Y' axis and a Z' axis.

In the AT-cut crystal resonator plate, it is known that, in the vibrating part, displacement of the piezoelectric vibration in the X axis direction is larger than displacement of the piezoelectric vibration in the Z' axis direction. In the configuration of Patent Document 1, the support part supports the vibrating part in the Z' axis direction where the displacement of the piezoelectric vibration is small. Thus, when the crystal resonator plate is piezoelectrically vibrated, such piezoelectric vibration is not likely to leak via the support part, which contributes to efficient piezoelectric vibration of the vibrating part.

PRIOR ART DOCUMENT

Patent Document

[Patent Document 1] WO 2016/121182

SUMMARY OF THE INVENTION

Problem to be Solved by the Invention

The crystal resonator plate disclosed in Patent Document 1 as described above has a configuration suitable for reducing vibration leakage from the vibrating part, while it has also a defect that is likely to cause disconnection or the like of an extraction electrode of the excitation electrode. This problem is described in detail below.

The above-described crystal resonator plate is manufactured by forming an external shape of the crystal plate in an etching step, and after that by forming electrodes and wiring on both main surfaces of the crystal plate. In the etching step, the rectangular-shaped crystal plate is subjected to at least two kinds of etching processing, i.e. external shape forming etching and frequency adjustment etching. Furthermore, when a mesa structure is formed on the center of the vibrating part, mesa-forming etching may be added.

In the external shape forming etching, a cut-out part is formed in the rectangular-shaped crystal plate, and thus, the external shape constituted of the vibrating part, the support part and the external frame part is formed. In the frequency adjustment etching, the thickness of the vibrating part and the support part is adjusted such that the oscillating frequency of the crystal resonator device is a predetermined value. In the frequency adjustment etching, the region of the vibrating part and the support part is mainly etched.

When the region of the vibrating part and the support part is etched for frequency adjustment, a stepped part is formed at the boundary between the support part and the external frame part due to the difference in thickness of the crystal plate. When the support part is formed so as to protrude from the vibrating part in the Z' direction of the AT-cut crystal, the boundary between the support part and the external frame part is a boundary parallel to the X axis. Therefore, the above stepped part is also formed along a line parallel to the X axis.

The cross-sectional shape of the above-described stepped part is affected by the crystal anisotropy of the crystal plate. When the boundary is parallel to the X axis, the stepped part has, on the at least one main surface, a cross-section perpendicular to the main surface. Also, when the stepped part is displaced to the side of the support part, a cross-section having a caved shape may be partially formed at the stepped part. Here, the caved shape means that the side surface of the stepped part is inclined beyond the vertical state so that the angle between the side surface of the stepped part and the main surface (i.e. the main surface of the support part or the main surface of the external frame part) is an acute angle.

In the crystal resonator plate, a lead-out wiring that is connected to the excitation electrode formed on the vibrating part is formed so as to reach the external frame part via the support part. Therefore, the lead-out wiring should be extended over the stepped part at the boundary between the support part and the external frame part. Also, the lead-out wiring is formed by the steps of: forming a metal film by sputtering; and after that patterning the metal film.

Since the lead-out wiring is formed as described above, when a vertically stepped part is formed at the boundary between the support part and the external frame part, it is difficult to ensure the metal film thickness made by sputtering, which leads to disconnection of the lead-out wiring that easily occurs. In other cases, even though the lead-out wiring is not disconnected, it may have a high resistance due to a thin film of the wiring. When the lead-out wiring has a high resistance on the excitation electrode, the vibration characteristics of the crystal resonator device are adversely affected. Furthermore, when the cross-section having the caved shape is generated in the stepped part, the above problem becomes more critical.

The present invention was made in consideration of the above circumstances, an object of which is to provide a crystal resonator plate that is capable of reducing vibration leakage from the vibrating part while reducing disconnection of the lead-out wiring, and also to provide a crystal resonator device including the above crystal resonator plate.

Means for Solving the Problem

In order to solve the above problem, an AT-cut crystal resonator plate according to a first embodiment of the present invention includes: a substantially rectangular-shaped vibrating part including a first excitation electrode formed on a first main surface and a second excitation electrode formed on a second main surface; a support part protruding from a corner of the vibrating part in a Z' axis direction of the AT-cut crystal resonator plate so as to support the vibrating part; and an external frame part surrounding an outer periphery of the vibrating part and supporting the support part. A boundary between the support part and the external frame part is on a side parallel to an X axis out of inner peripheral sides of the external frame part. The vibrating part and at least part of the support part are made as an etching region having a thickness thinner than a thickness of the external frame part, and a stepped part is generated in a vicinity of the boundary between the support part and the external frame part due to the etching region. A lead-out wiring extended from each of the first excitation electrode and the second excitation electrode is formed over the support part to the external frame part so as to overlap with the stepped part. On at least one of the first main surface and the second main surface, at least part of the stepped part that is superimposed on the lead-out wiring is formed so as not to be parallel to the X axis in plan view.

In the etching region where the thickness of the support part is thinner than the thickness of the external frame part, a stepped part is formed at the boundary of the etching region due to the difference in thickness of the crystal plate. On the at least one of the first main surface and the second main surface, where the boundary of the etching region is parallel to the X axis, the stepped part has a vertical cross-section (sometimes, a caved cross-section). In contrast, with the above-described configuration, at least part of the stepped part that is superimposed on the lead-out wiring is formed so as not to be parallel to the X axis in plan view. Since this part of the stepped part can be formed as a gentle stepped part, it is possible to prevent disconnection or the like of the lead-out wiring on the stepped part.

In the above-described crystal resonator plate, the at least part of the stepped that is superimposed on the lead-out wiring may be formed as a straight line part that is not parallel to the X axis in plan view.

With the above-described configuration, the at least part of the stepped part that is superimposed on the lead-out wiring is formed as a straight line part, which leads to formation of a further elongated gently stepped part. Thus, it is possible to further effectively reduce disconnection or the like of the lead-out wiring on the stepped part.

In the above-described crystal resonator plate, the straight line part may intersect orthogonally with the X axis in plan view.

With the above-described configuration, the stepped part becomes gentler as its angle made with the X axis in plan view is close to the right angle, and the stepped part is the most gentle at the part where the angle made with the X axis is the right angle in plan view. Therefore, it is possible to further effectively reduce disconnection or the like of the lead-out wiring on the stepped part.

In the above-described crystal resonator plate, a length of the straight line part may be half or more a width of the lead-out wiring, or may also be not less than the width of the lead-out wiring.

With the above-described configuration in which the length of the straight line part is not less than the width of the lead-out wiring, it is possible to further effectively reduce disconnection or the like of the lead-out wiring on the stepped part.

In the above-described crystal resonator plate, the stepped part may be formed on the external frame part side relative to the boundary between the support part and the external frame part.

With the above-described configuration, it is possible to improve the rigidity of the support part while preventing generation of the caved cross-section in the stepped part.

In the at least one of the first main surface and the second main surface of the above-described crystal resonator plate, the etching region may have an entering part that is formed to enter part of the external frame part from the support part such that a boundary of the entering part of the etching region is the stepped part. A start point of the stepped part on the −X side may be formed within the connection area between the support part and the external frame part.

With the above-described configuration, it is possible to reduce the area of the entering part and accordingly to maintain a bonding area on the external frame part to the sealing members. Thus, it is possible to prevent degradation of the bonding strength and the sealing characteristics of the crystal resonator device.

Also, an AT-cut crystal resonator plate according to a second embodiment of the present invention includes: a substantially rectangular-shaped vibrating part including a first excitation electrode formed on a first main surface and a second excitation electrode formed on a second main surface; a support part protruding from a corner of the vibrating part in the Z' axis direction of the AT-cut crystal resonator plate so as to support the vibrating part; and an external frame part surrounding an outer periphery of the vibrating part and supporting the support part. The vibrating part and the support part are made as an etching region having a thickness thinner than a thickness of the external frame part, and furthermore, on at least one of the first main surface and the second main surface, the etching region has an entering part that is formed to enter part of the external frame part from the support part. A start point of a boundary of the entering part of the etching region is formed at a position shifted from an extension line of a side of the support part on the −X side.

In the case in which the start point of the boundary of the entering part of the etching region is formed on the extension line of the side of the support part on the −X side, a recess is generated at the time of etching at the corner of the connecting part that connects the support part to the external frame part. When such a recess is generated, the recess acts as a stress concentration point, which leads to degradation of impact resistance. With the above-described configuration, since the start point of the boundary of the entering part of the etching region is formed at a position shifted from the extension line of the side of the support part on the −X side, it is possible to avoid generation of the recess, which results in prevention of degradation of the impact resistance. Also, since the entering part is formed in the etching region, a part that is gently stepped is formed by the etching. Thus, it is possible to prevent disconnection or the like by causing the wiring (lead-out wiring of the excitation electrode) to pass over the gently stepped part.

In the above-described crystal resonator plate, the start point of the boundary of the entering part of the etching region on the −X side may be formed within a connection area between the support part and the external frame part.

With the above-described configuration, it is possible to reduce the area of the entering part, and accordingly to sufficiently maintain a bonding area on the external frame part to the sealing members in the crystal resonator device in which the crystal resonator plate is used. Thus, it is possible to prevent degradation of the bonding strength and the sealing characteristics. Also, since the entering part as a thinner region is reduced, it is possible to improve the rigidity of the connecting part that connects the external frame part to the support part.

Also in the above-described crystal resonator plate, the entering part may be formed on only one main surface out of the first main surface and the second main surface.

With the above-described configuration, it is possible to avoid unnecessary reduction of the plate thickness caused by forming the entering part, which leads to prevention of reduction of rigidity of the crystal resonator plate.

In order to solve the above problem, a crystal resonator device of the present invention includes: the crystal resonator plate as described above; a first sealing member covering the first main surface of the crystal resonator plate; and a second sealing member covering the second main surface of the crystal resonator plate.

Effect of the Invention

In the crystal resonator plate and the crystal resonator device of the present invention, a gently stepped part is formed at the boundary of an etching region in the vicinity of a connecting part that connects an external frame part to a support part, and a lead-out wiring of an excitation electrode is formed so as to pass over the gently stepped part. Thus, the present invention exerts an advantageous effect of preventing disconnection and increased resistance of the wiring on a stepped part generated at the boundary of the etching region.

In the crystal resonator plate and the crystal resonator device of the present invention, since the start point of the boundary of the entering part of the etching region is formed at a position shifted from the extension line of the side of the support part on the −X side, it is possible to avoid generation of the recess in the connecting part that connects the support part to the external frame part, which results in prevention of degradation of the impact resistance caused by the recess.

BRIEF DESCRIPTION OF THE DRAWINGS

FIG. 8 (a) is a schematic plan view of the first main surface while FIG. 8 (b) is a schematic plan view of the second main surface.

FIG. 9 (a) is a schematic plan view of a first main surface. FIGS. 9 (b) and 9 (c) are schematic cross-sectional views of the first main surface while FIG. 9 (d) is a schematic cross-sectional view of the second main surface.

FIGS. 11 (a) and 11 (b) schematically indicate variations of the respective shapes of the etching region and the lead-out wiring in plan view.

FIGS. 12 (a) and 12 (b) schematically indicate variations of the respective shapes of the etching region and the lead-out wiring in plan view.

FIGS. 15 (a) to 15 (c) indicate, in the crystal resonator plate whose etching region has the entering part, respective examples of a recess generated at a corner of the connecting part that connects the support part to the external frame part.

FIGS. 17 (*a*) and 17 (*b*) each indicate a variation of the shape of the entering part.

MEANS FOR CARRYING OUT THE INVENTION

First Embodiment

Hereinafter, an embodiment of the present invention will be described in detail with reference to the drawings. In the following embodiment, the present invention is applied to a crystal resonator device as a crystal oscillator. However, the crystal resonator device to which the present invention is applied is not limited to the crystal oscillator. The present invention may be applied to a crystal resonator.

—Crystal Oscillator—

Figure 1:
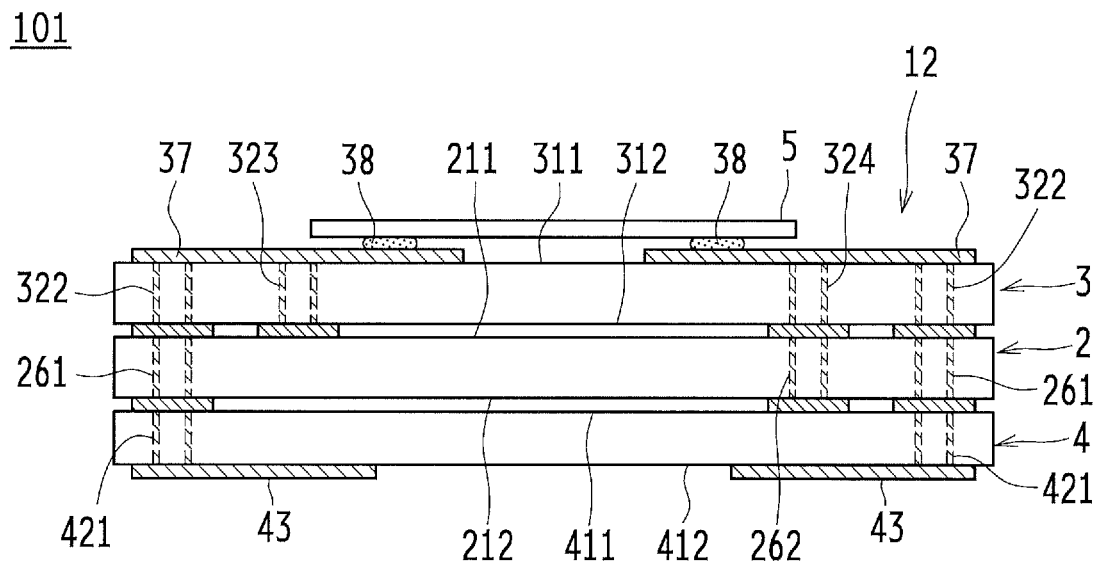
FIG. 1 is a schematic configuration diagram schematically illustrating a configuration of a crystal oscillator according to an embodiment.

As shown in FIG. 1, a crystal oscillator 101 according to this embodiment includes: a crystal resonator plate 2; a first sealing member 3; a second sealing member 4; and an IC chip 5. In this crystal oscillator 101, the crystal resonator plate 2 is bonded to the first sealing member 3, and furthermore the crystal resonator plate 2 is bonded to the second sealing member 4. Thus, a package 12 having a sandwich structure is formed so as to have a substantially rectangular parallelepiped shape. Also, the IC chip 5 is mounted on a main surface of the first sealing member 3 so as to be opposed to a surface bonded to the crystal resonator plate 2. The IC chip 5 as an electronic component element is a one-chip integrated circuit element constituting, with the crystal resonator plate 2, an oscillation circuit.

In the crystal resonator plate 2, a first excitation electrode 221 is formed on a first main surface 211 as one main surface while a second excitation electrode 222 is formed on a second main surface 212 as the other main surface. In the crystal oscillator 101, the first sealing member 3 and the second sealing member 4 are bonded respectively to the main surfaces (the first main surface 211 and the second main surface 212) of the crystal resonator plate 2, thus an internal space of the package 12 is formed. In this internal space, a vibrating part 22 (see FIGS. 4 and 5) including the first excitation electrode 221 and the second excitation electrode 222 is hermetically sealed.

The crystal oscillator 101 according to this embodiment has, for example, a package size of 1.0×0.8 mm, which is reduced in size and height. According to the size reduction, no castellation is formed in the package 12. Through holes (described later) are used for conduction between electrodes.

Next, the respective components of the above-described crystal oscillator 101 (i.e. the crystal resonator plate 2, the first sealing member 3 and the second sealing member 4) will be described referring to FIGS. 1 to 7. Here, each of the components will be described as a single body without being bonded.

Figure 4:
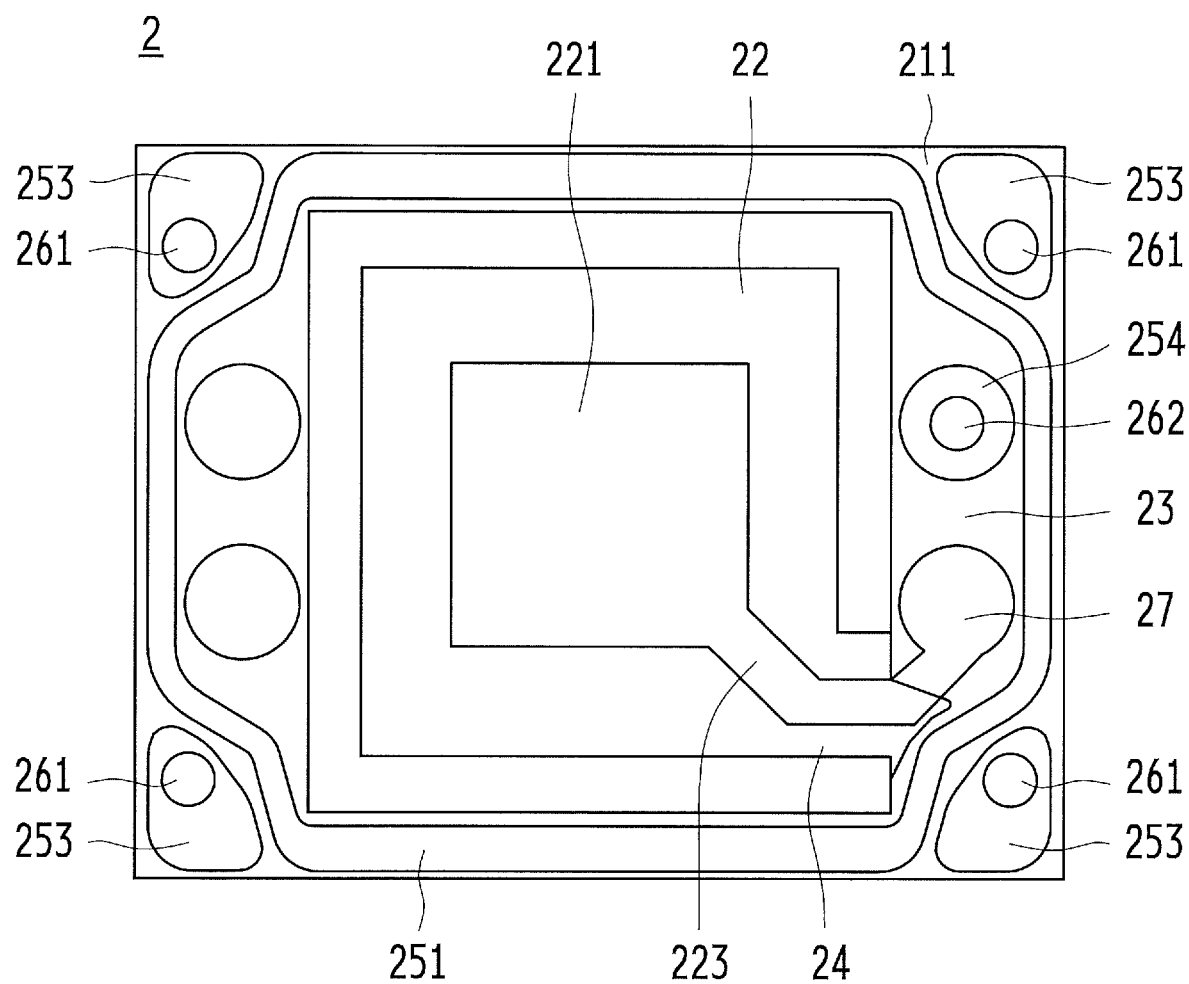
FIG. 4 is a schematic plan view illustrating a first main surface of a crystal resonator plate of the crystal oscillator.
Figure 4:
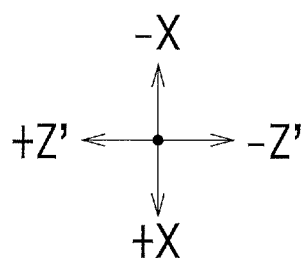
Figure 5:
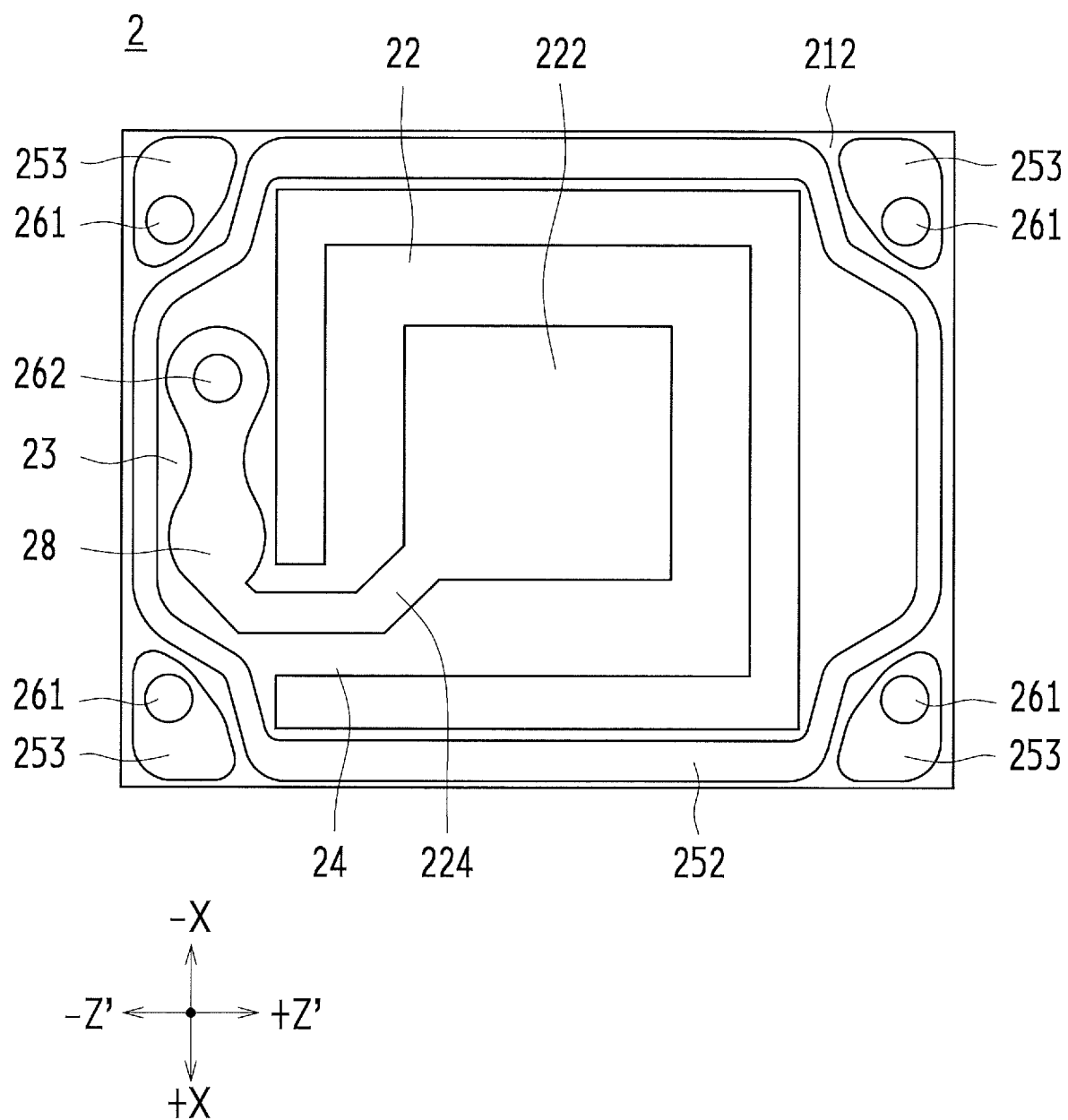
FIG. 5 is a schematic plan view illustrating a second main surface of the crystal resonator plate of the crystal oscillator.

The crystal resonator plate 2 is a piezoelectric substrate made of crystal as shown in FIGS. 4 and 5. Both main surfaces (i.e. the first main surface 211 and the second main surface 212) are formed as smooth flat surfaces (mirror-finished). In this embodiment, an AT-cut crystal plate that causes thickness shear vibration is used as the crystal resonator plate 2. In the crystal resonator plate 2 shown in FIGS. 4 and 5, each main surface 211 and 212 of the crystal resonator plate 2 is an XZ' plane. On this XZ' plane, the direction parallel to the lateral direction (short side direction) of the crystal resonator plate 2 is the X axis direction, and the direction parallel to the longitudinal direction (long side direction) of the crystal resonator plate 2 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the directions in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a support part 24 that supports the vibrating part 22 by connecting the vibrating part 22 to the external frame part 23. That is, the crystal resonator plate 2 has a configuration in which the vibrating part 22, the external frame part 23 and the support part 24 are integrally formed.

In this embodiment, the support part 24 is provided at only one position between the vibrating part 22 and the external frame part 23. As described later in detail, the vibrating part 22 and the support part 24 each have, basically, a thickness less than a thickness of the external frame part 23. Due to the difference in thickness between the external frame part 23 and the support part 24, the natural frequency of piezoelectric vibration differs between the external frame part 23 and the support part 24. Thus, the external frame part 23 is not likely to resonate with the piezoelectric vibration of the support part 24. The support part 24 is not necessarily formed at one part. The support part 24 may be formed at each of two parts between the vibrating part 22 and the external frame part 23 (for example, both sides in the −Z' axis direction).

The support part 24 extends (protrudes) from only one corner part positioned in the +X direction and in the −Z' direction of the vibrating part 22 to the external frame part 23 in the −Z' direction. Thus, since the support part 24 is disposed on the corner part where displacement of the piezoelectric vibration is relatively small in an outer peripheral edge part of the vibrating part 22, it is possible to prevent leakage of the piezoelectric vibration to the external frame part 23 via the support part 24 compared to the case in which the support part 24 is provided on the position other than the corner part (i.e. central part of the respective sides). Thus, the vibrating part 22 is piezoelectrically vibrated more effectively. It is also possible to reduce stress applied to the vibrating part 22 compared to the case in which two or more support parts 24 are provided. Thus, it is possible to reduce frequency shift of the piezoelectric vibration caused by the stress. Accordingly, it is possible to improve the stability of the piezoelectric vibration.

The first excitation electrode 221 is provided on the first main surface 211 side of the vibrating part 22 while the second excitation electrode 222 is provided on the second main surface 212 side of the vibrating part 22. The first excitation electrode 221 and the second excitation electrode 222 are respectively connected to lead-out wirings (a first lead-out wiring 223 and a second lead-out wiring 224) so that these excitation electrodes are connected to external electrode terminals. The first lead-out wiring 223 is drawn from the first excitation electrode 221 and connected to a connection bonding pattern 27 formed on the external frame part 23 via the support part 24. The second lead-out wiring 224 is drawn from the second excitation electrode 222 and connected to a connection bonding pattern 28 formed on the external frame part 23 via the support part 24. Thus, the first lead-out wiring 223 is formed on the first main surface 211 side of the support part 24 while the second lead-out wiring 224 is formed on the second main surface 212 side of the support part 24.

Resonator-plate-side sealing parts to bond the crystal resonator plate 2 respectively to the first sealing member 3 and the second sealing member 4 are provided on the respective main surfaces (i.e. the first main surface 211 and the second main surface 212) of the crystal resonator plate 2. As the resonator-plate-side sealing part on the first main surface 211, a resonator-plate-side first bonding pattern 251 is formed so as to be bonded to the first sealing member 3. As the resonator-plate-side sealing part on the second main surface 212, a resonator-plate-side second bonding pattern 252 is formed so as to be bonded to the second sealing member 4. The resonator-plate-side first bonding pattern 251 and the resonator-plate-side second bonding pattern 252 are each formed on the external frame part 23 so as to have an annular shape in plan view. The first excitation electrode 221 and the second excitation electrode 222 are not electrically connected to the resonator-plate-side first bonding pattern 251 and the resonator-plate-side second bonding pattern 252.

Also, as shown in FIGS. 4 and 5, five through holes are formed in the crystal resonator plate 2 so as to penetrate between the first main surface 211 and the second main surface 212. More specifically, four first through holes 261 are respectively disposed in the four corners (corner parts) of the external frame part 23. A second through hole 262 is disposed in the external frame part 23, on one side in the Z' axis direction relative to the vibrating part 22 (in FIGS. 4 and 5, on the side in the +Z' direction). Connection bonding patterns 253 are formed on the respective peripheries of the first through holes 261. Also, on the periphery of the second through hole 262, a connection bonding pattern 254 is formed on the first main surface 211 side while the connection bonding pattern 28 is formed on the second main surface 212 side.

In the first through holes 261 and the second through hole 262, through electrodes are respectively formed along a corresponding inner wall surface of the above through holes so as to establish conduction between the electrodes formed on the first main surface 211 and the second main surface 212. Respective central parts of the first through holes 261 and the second through hole 262 are hollow through parts penetrating between the first main surface 211 and the second main surface 212.

In the crystal resonator plate 2, it is possible to form the following elements by the same process: the first excitation electrode 221; the second excitation electrode 222; the first lead-out wiring 223; the second lead-out wiring 224, the first bonding pattern 251; the resonator-plate-side second bonding pattern 252; and the connection bonding patterns 253, 254, 27 and 28. Specifically, each of them can be formed by: a base film deposited on the main surface (the first main surface 211 or the second main surface 212) of the crystal resonator plate 2 by the physical vapor deposition; and a bonding film deposited on the base film by the physical vapor deposition. In this embodiment, the base film is made of Ti (or Cr), and the bonding film is made of Au.

Figure 2:
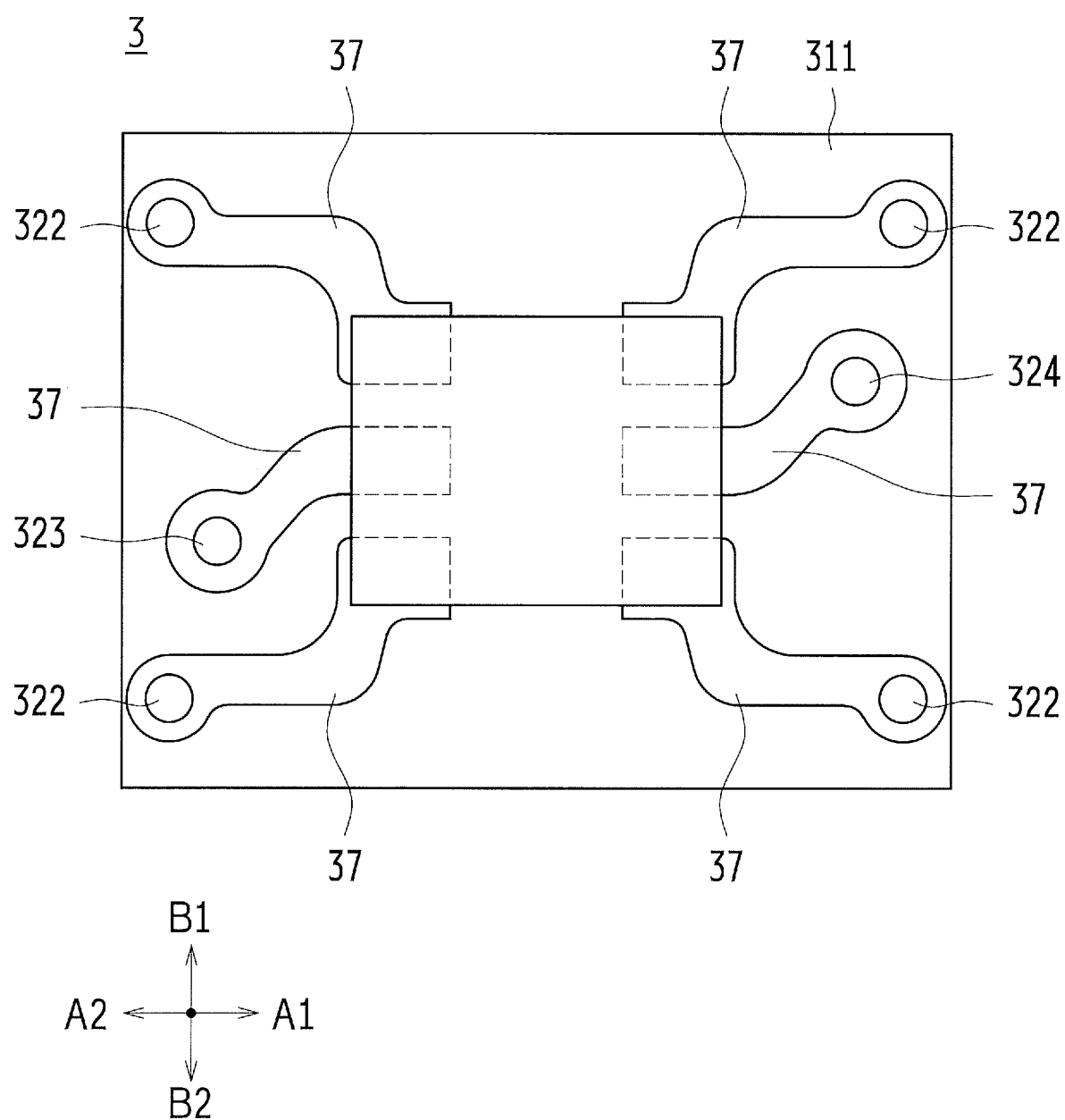
FIG. 2 is a schematic plan view illustrating a first main surface of a first sealing member of the crystal oscillator.
Figure 3:
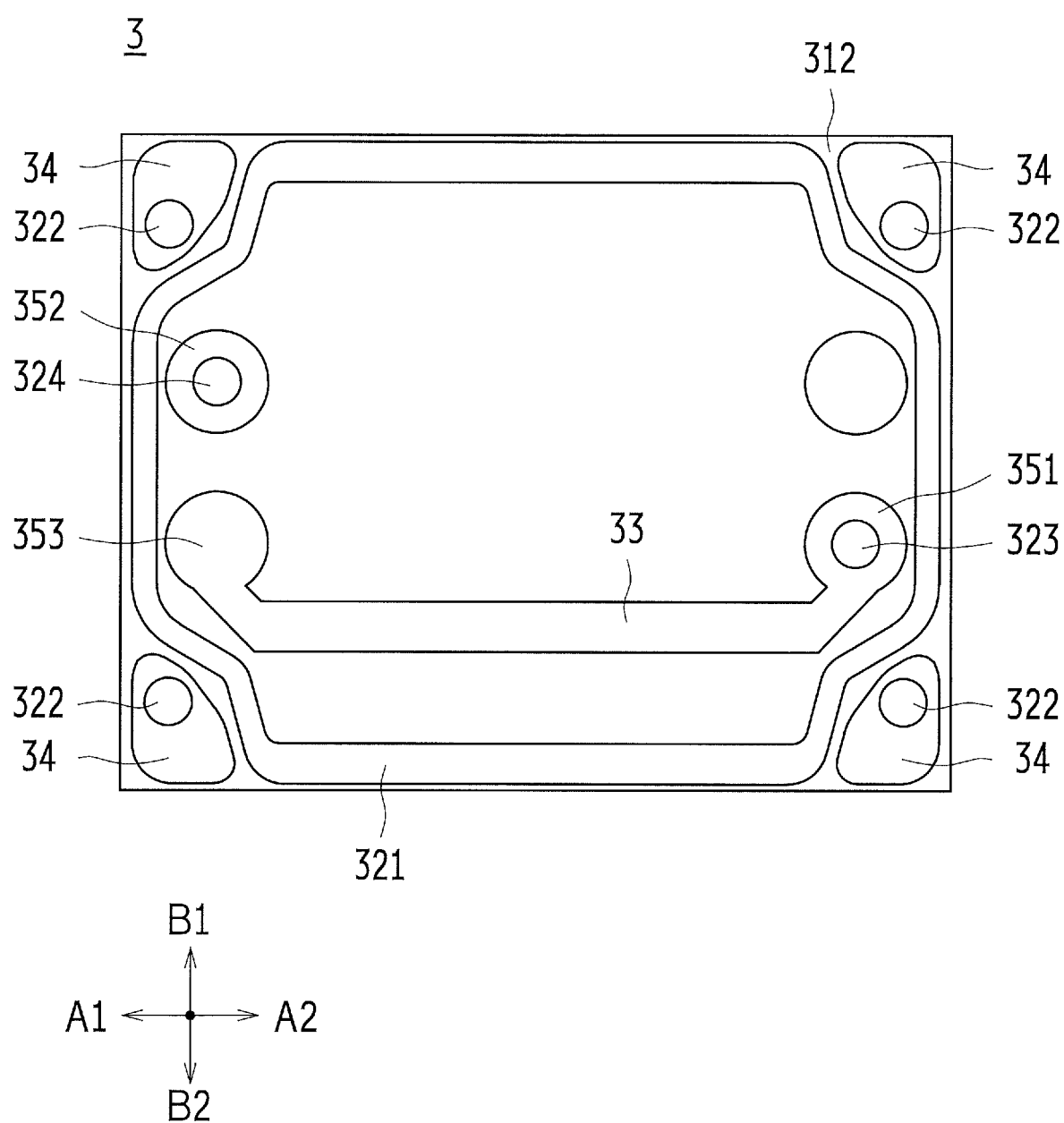
FIG. 3 is a schematic plan view illustrating a second main surface of the first sealing member of the crystal oscillator.

As shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

As shown in FIG. 2, on a first main surface 311 (the surface on which the IC chip 5 is mounted) of the first sealing member 3, six electrode patterns 37 are formed, which include mounting pads for mounting the IC chip 5 as an oscillation circuit element. The IC chip 5 is bonded to the electrode patterns 37 by the flip chip bonding (FCB) method using a metal bump (for example, Au bump) 38 (see FIG. 1).

As shown in FIGS. 2 and 3, six through holes are formed in the first sealing member 3 so as to be respectively connected to the six electrode patterns 37 and also to penetrate between the first main surface 311 and the second main surface 312. More specifically, four third through holes 322 are respectively disposed in the four corners (corner parts) of the first sealing member 3. Fourth and fifth through holes 323 and 324 are disposed respectively in the A2 direction and in the A1 direction in FIGS. 2 and 3. The A1 direction and the A2 direction in FIGS. 2, 3, 6 and 7 respectively correspond to the −Z' direction and the +Z' direction in FIGS. 4 and 5, and the B1 direction and B2 direction in FIGS. 2, 3, 6 and 7 respectively correspond to the −X direction and the +X direction in FIGS. 4 and 5.

In the third through holes 322 and the fourth and fifth through holes 323 and 324, through electrodes are respectively formed along a corresponding inner wall surface of the above through holes so as to establish conduction between the electrodes formed on the first main surface 311 and the second main surface 312. Respective central parts of the third through holes 322 and the fourth and fifth through holes 323 and 324 are hollow through parts penetrating between the first main surface 311 and the second main surface 312.

On the second main surface 312 of the first sealing member 3, a sealing-member-side first bonding pattern 321 is formed as a sealing-member-side first sealing part so as to be bonded to the crystal resonator plate 2. The sealing-member-side first bonding pattern 321 is formed so as to have an annular shape in plan view.

On the second main surface 312 of the first sealing member 3, connection bonding patterns 34 are respectively formed on the peripheries of the third through holes 322. A connection bonding pattern 351 is formed on the periphery of the fourth through hole 323, and a connection bonding pattern 352 is formed on the periphery of the fifth through hole 324. Furthermore, a connection bonding pattern 353 is formed on the side opposed to the connection bonding pattern 351 in the long axis direction of the first sealing member 3 (i.e. on the side of the A2 direction). The connection bonding pattern 351 and the connection bonding pattern 353 are connected to each other via a wiring pattern 33. The connection bonding pattern 353 is not connected to the connection bonding pattern 352.

In the first sealing member 3, it is possible to form the following elements by the same process: the sealing-member-side first bonding pattern 321; the connection bonding patterns 34, and 351 to 353; and the wiring pattern 33. Specifically, each of them can be formed by: a base film deposited on the second main surface 312 of the first sealing member 3 by the physical vapor deposition; and a bonding film deposited on the base film by the physical vapor deposition. In this embodiment, the base film is made of Ti (or Cr), and the bonding film is made of Au.

Figure 6:
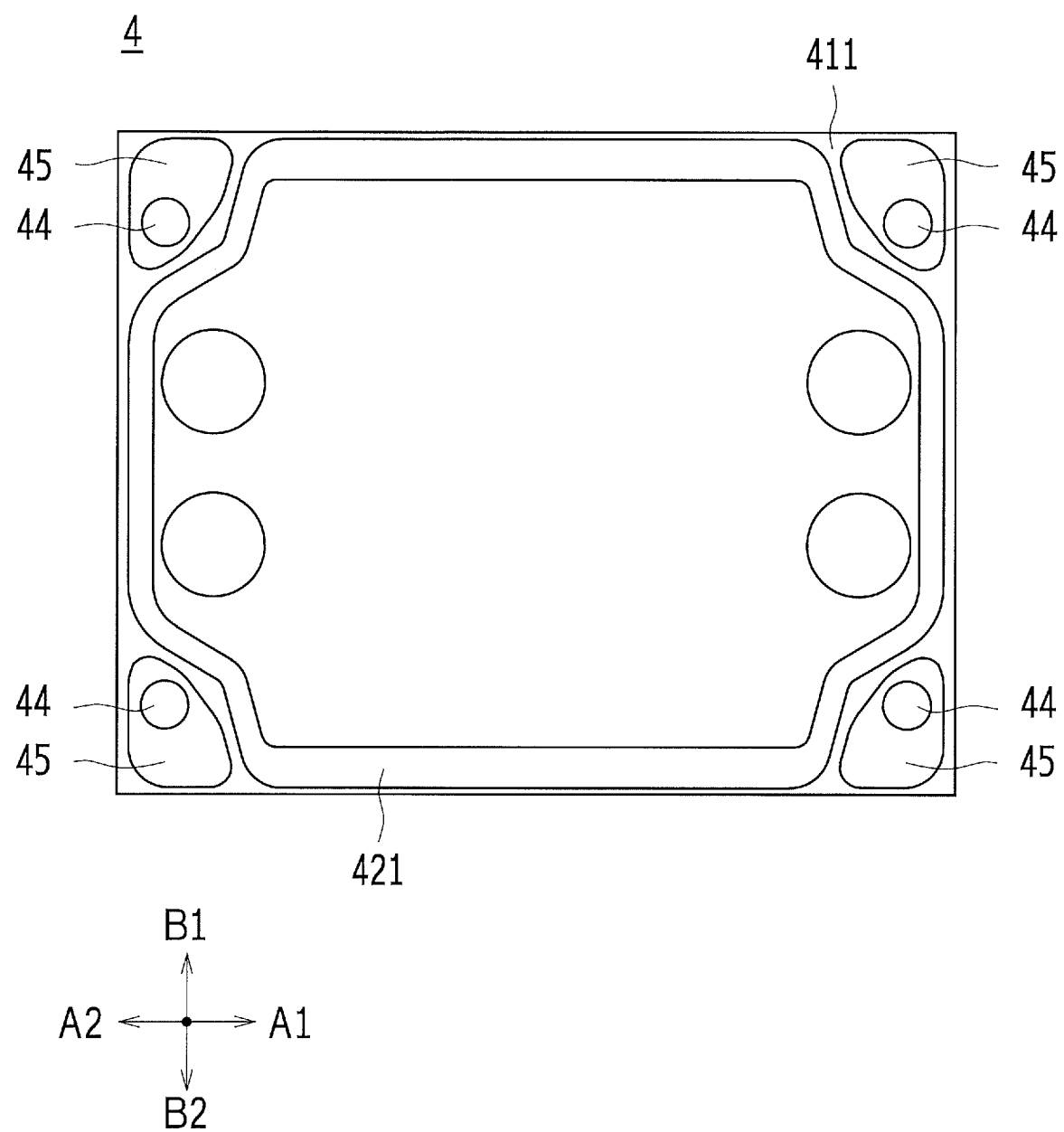
FIG. 6 is a schematic plan view illustrating a first main surface of a second sealing member of the crystal oscillator.
Figure 7:
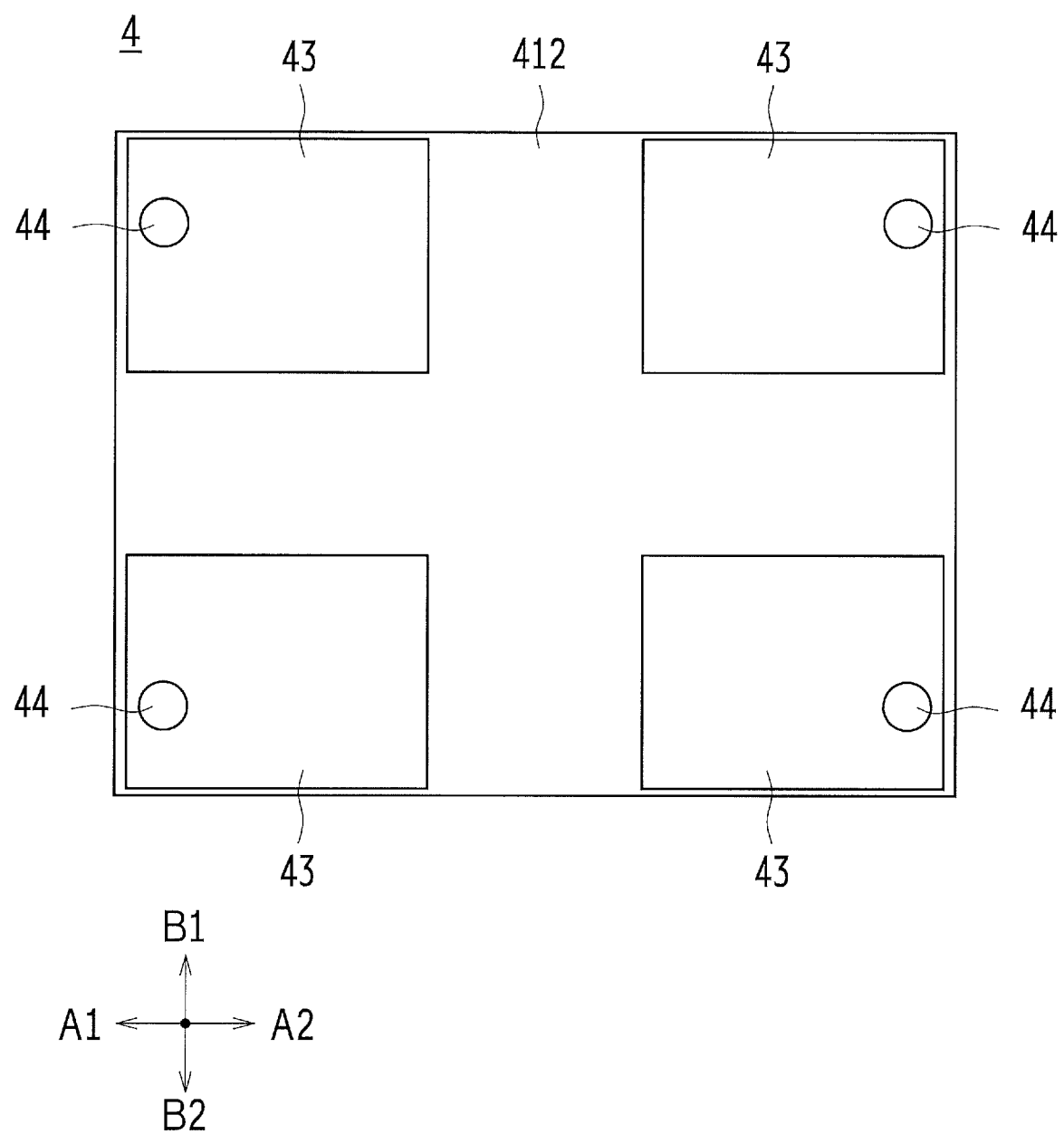
FIG. 7 is a schematic plan view illustrating a second main surface of the second sealing member of the crystal oscillator.

As shown in FIGS. 6 and 7, the second sealing member 4 is a substrate having a rectangular parallelepiped shape that is made of a single glass wafer. A first main surface 411

(a surface to be bonded to the crystal resonator plate 2) of the second sealing member 4 is formed as a smooth flat surface (mirror finished).

On the first main surface 411 of the second sealing member 4, a sealing-member-side second bonding pattern 421 is formed as a sealing-member-side second sealing part so as to be bonded to the crystal resonator plate 2. The sealing-member-side second bonding pattern 421 is formed so as to have an annular shape in plan view.

Four external electrode terminals 43, which are electrically connected to the outside, are formed on a second main surface 412 (the outer main surface not facing the crystal resonator plate 2) of the second sealing member 4. The external electrode terminals 43 are respectively located at four corner (corner parts) of the second sealing member 4.

As shown in FIGS. 6 and 7, four through holes are formed in the second sealing member 4 so as to penetrate between the first main surface 411 and the second main surface 412. More specifically, four sixth through holes 44 are respectively disposed in the four corners (corner parts) of the second sealing member 4. In the sixth through holes 44, through electrodes are respectively formed along a corresponding inner wall surface of the above through holes so as to establish conduction between the electrodes formed on the first main surface 411 and the second main surface 412. Respective central parts of the sixth through holes 44 are hollow through parts penetrating between the first main surface 411 and the second main surface 412. On the first main surface 411 of the second sealing member 4, connection bonding patterns 45 are respectively formed on the peripheries of the sixth through holes 44.

In the second sealing member 4, it is possible to form the following elements by the same process: the sealing-member-side second bonding pattern 421; and the connection bonding patterns 45. Specifically, each of them can be formed by: a base film deposited on the first main surface 411 of the second sealing member 4 by the physical vapor deposition; and a bonding film deposited on the base film by the physical vapor deposition. In this embodiment, the base film is made of Ti (or Cr), and the bonding film is made of Au.

In the crystal oscillator 101 including the crystal resonator plate 2, the first sealing member 3 and the second sealing member 4, the crystal resonator plate 2 and the first sealing member 3 are subjected to the diffusion bonding in a state in which the resonator-plate-side first bonding pattern 251 and the sealing-member-side first bonding pattern 321 are superimposed on each other, and the crystal resonator plate 2 and the second sealing member 4 are subjected to the diffusion bonding in a state in which the resonator-plate-side second bonding pattern 252 and the sealing-member-side second bonding pattern 421 are superimposed on each other, thus, the package 12 having the sandwich structure shown in FIG. 1 is produced. Accordingly, the internal space of the package 12, i.e. the space to house the vibrating part 22 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 221, the second excitation electrode 222, the IC chip 5 and the external electrode terminals 43 of the crystal oscillator 101.

More specifically, the first excitation electrode 221 is connected to the IC chip 5 via the first lead-out wiring 223, a bonding part between the connection bonding pattern 27 and the connection bonding pattern 353, the wiring pattern 33, the connection bonding pattern 351, the through electrode in the fourth through hole 323, and the electrode pattern 37 in this order. The second excitation electrode 222 is connected to the IC chip via the second lead-out wiring 224, the connection bonding pattern 28, the through electrode in the second through hole 262, a bonding part between the connection bonding pattern 254 and the connection bonding pattern 352, the through electrode in the fifth through hole 324, and the electrode pattern 37 in this order. Also, the IC chip 5 is connected to the external electrode terminals 43 via the electrode patterns 37, the through electrodes in the third through holes 322, bonding parts between the connection bonding patterns 34 and the connection bonding patterns 253, the through electrodes in the first through holes 261, bonding parts between the connection bonding patterns 253 and the connection bonding patterns 45, and the through electrodes in the sixth through holes 44 in this order.

The above is a main configuration of the crystal oscillator 101 according to this embodiment. Meanwhile, a feature of the present invention is a relationship between the shape of a stepped part and the position of the lead-out wiring formed on the stepped part, in which the stepped part is generated by the difference in thickness between the external frame part 23 and the support part 24 of the crystal resonator plate 2. Hereinafter, this feature is described in detail.

Figure 8:
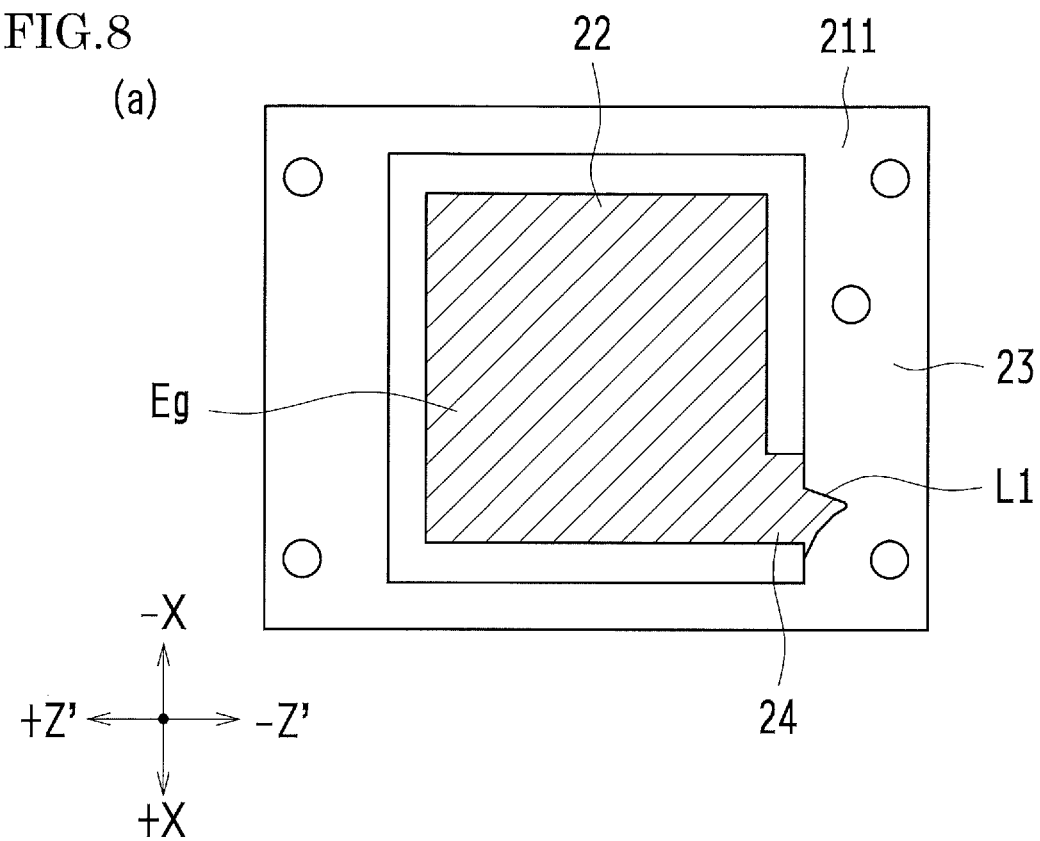
FIG. 8 are diagrams respectively illustrating a state of the crystal resonator plate immediately after being subjected to an etching step of the crystal plate.
Figure 8:
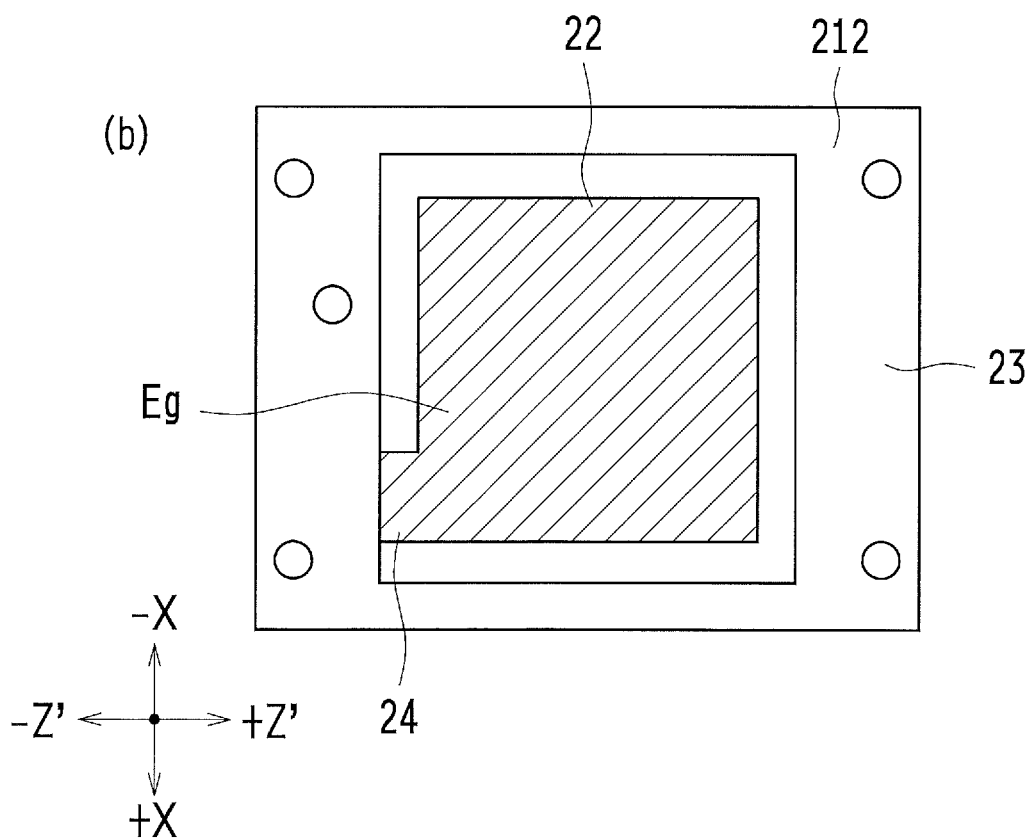

FIG. 8 are diagrams respectively illustrating a state of the crystal resonator plate 2 immediately after being subjected to an etching step of the crystal plate (i.e. a state before the electrodes and the wirings are formed). FIG. 8(*a*) is a plan view of the first main surface 211 while FIG. 8 (*b*) is a plan view of the second main surface 212. In the example shown in FIG. 8, no mesa structure is formed on the center of the vibrating part. The rectangular-shaped crystal plate is subjected to the etching treatment two times, i.e. to the external shape forming etching and the frequency adjustment etching.

In the external shape forming etching, a cut-out part is formed in the rectangular-shaped crystal plate so as to define respective external shapes of the vibrating part 22, the external frame part 23 and the support part 24. The through holes in the crystal resonator plate 2 are also formed in the external shape forming etching.

In the frequency adjustment etching, the respective thicknesses of the vibrating part 22 and the support part 24 are adjusted so that the oscillating frequency of the crystal resonator device is a predetermined value. In FIG. 8, an etching region Eg made by the frequency adjustment etching is indicated by the hatched lines. The etching region Eg includes the vibrating part 22 and at least part of the support part 24, and has a thickness thinner than the thickness of the external frame part 23.

At the boundary of the etching region Eg, a stepped part is formed due to the difference in thickness of the crystal plate. As described above, when a boundary line making the stepped part is parallel to the X axis, the stepped part has a cross-section perpendicular to the main surface of the crystal plate. In addition, sometimes the side surface of the stepped part is further inclined from the vertical state so as to have a caved shape in which the angle between the side surface of the stepped part and the main surface (i.e. the main surface of the support part or the main surface of the external frame part) is an acute angle. Also as described above, when the lead-out wiring extended from the excitation electrode is formed over the stepped part having the vertical cross-section or the stepped part having the caved shape, disconnection of the lead-out wiring is likely to occur.

Figure 9:
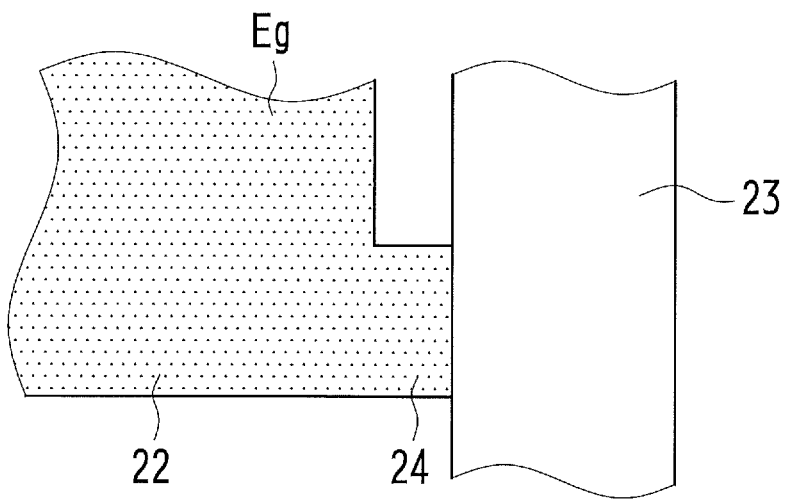
FIG. 9 are enlarged diagrams each illustrating part of the crystal resonator plate in the vicinity of a connecting part that connects a support part to an external frame part.
Figure 9:
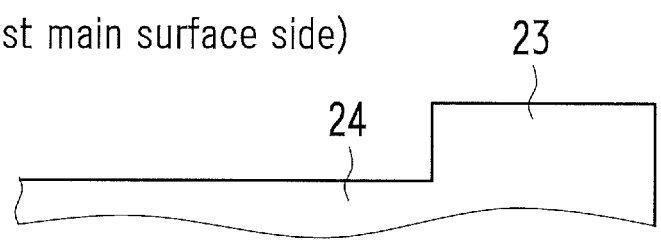
Figure 9:
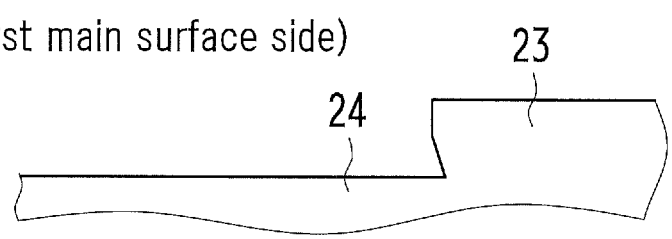
Figure 9:
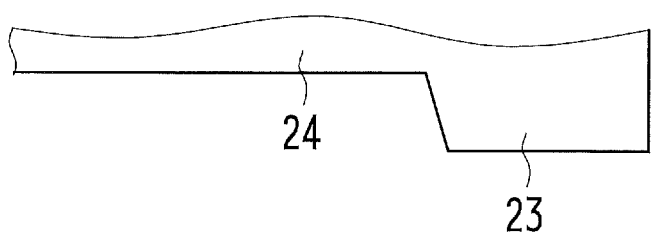

In this embodiment, the support part 24 extends (protrudes) from only one corner part positioned in the +X direction and in the −Z' direction of the vibrating part 22 to the external frame part 23 in the −Z' direction. In this case, the boundary between the support part 24 and the external frame part 23 is on the side parallel to the X axis out of the inner peripheral sides of the external frame part. Therefore, when the boundary of the etching region Eg is matched with the boundary between the support part 24 and the external frame part 23 (see FIG. 9 (*a*)), the stepped part having the vertical cross-section (see FIG. 9 (*b*)) or the stepped part having the caved shape (see FIG. 9 (*c*)) may be generated at the boundary of the etching region Eg, as described above. However, such a stepped part having the vertical cross-section is generated basically on one main surface, not on both main surfaces, due to the crystal anisotropy of the crystal plate. That is, when the boundary of the etching region Eg on the first main surface 211 side is a stepped part having the vertical cross-section, the boundary of the etching region Eg on the second main surface 212 side is a gentle stepped part (see FIG. 9 (*d*)). Here, the gentle shape means that the side surface of the stepped part is inclined so that the angle between the side surface of the stepped part and the main surface (i.e. the main surface of the support part or the main surface of the external frame part) is an obtuse angle.

The crystal resonator plate 2 according to this embodiment has a feature that the boundary shape of the etching region Eg is devised in order to prevent disconnection of the lead-out wiring extended from the excitation electrode. However, this sort of reflection is only required for one main surface of the crystal plate (here, the first main surface 211). Thus, on the other main surface (here, the second main surface 212), the boundary of the etching region Eg may be matched with the boundary between the support part 24 and the external frame part 23, as conventionally formed (see FIG. 8 (*b*)).

Figure 10:
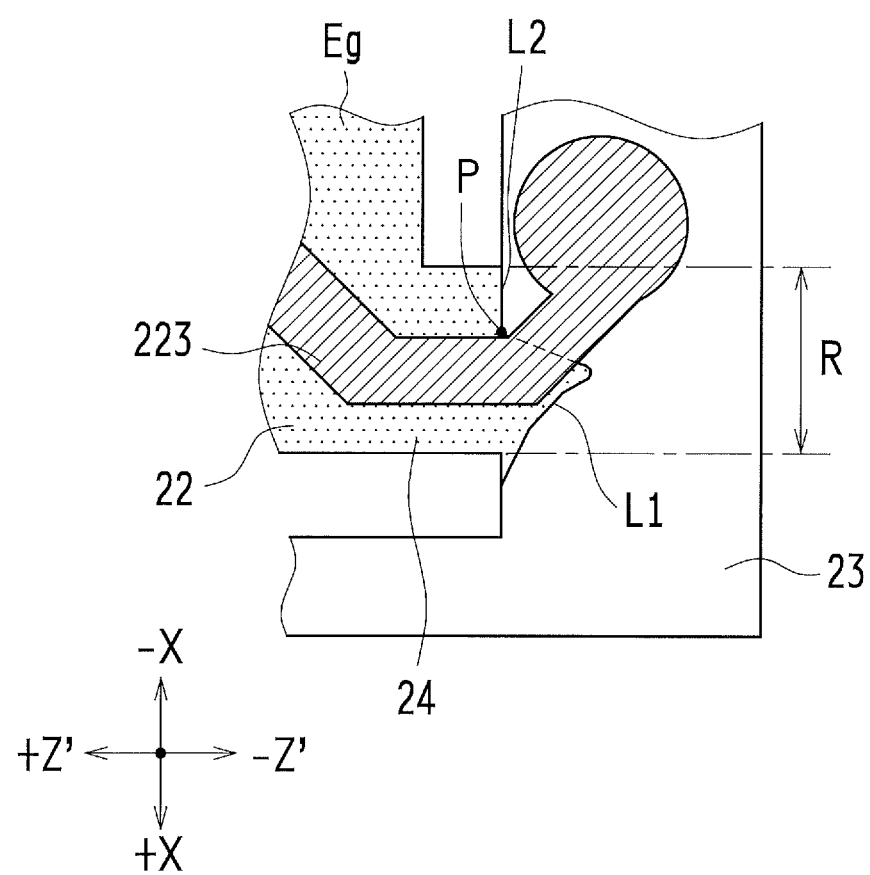
FIG. 10 is an enlarged diagram illustrating part of the crystal resonator plate in the vicinity of the connecting part that connects the support part to the external frame part, which schematically indicating respective shapes of an etching region and a lead-out wiring in plan view.

On the first main surface 211 of the crystal resonator plate 2, to which a treatment for preventing disconnection as the feature of the present invention is performed, the boundary of the etching region Eg is not matched with the boundary between the support part 24 and the external frame part 23. At least part of the boundary of the etching region Eg is a boundary line L1 that is not parallel to the X axis, as shown in FIG. 10. In this case, the stepped part generated at the boundary line L1 is neither a stepped part having the vertical cross-section nor a stepped part having the caved shape, but is a gentle stepped part. Furthermore, the first lead-out wiring 223 on the first main surface 211 is formed so as to pass over at least part of the boundary line L1.

In this way, at least part of the stepped part that is superimposed on the first lead-out wiring 223 is formed so as not to be parallel to the X axis in plan view. In the part, which is not parallel to the X axis, of the stepped part that is superimposed on the first lead-out wiring 223, the first lead-out wiring 223 is formed on a gentle stepped part. Therefore, it is possible to sufficiently ensure the film thickness of the wiring on this part, which contributes to prevention of disconnection and increased resistance of the first lead-out wiring 223.

The shape of the boundary of the etching region Eg is not limited to the example indicated in FIG. 10. Various other examples of the shape may be included. Some variations of the shape of the boundary of the etching region Eg are indicated in FIGS. 11 (*a*), 11 (*b*), 12 (*a*), 12 (*b*) and 13.

In the example indicated in FIG. 10, the boundary of the etching region Eg includes not only the boundary line L1 that is not parallel to the X axis, but also a boundary line L2 that is parallel to the X axis. However, as shown in FIGS. 11 (*a*), 11 (*b*) and 13, the entire etching region Eg may be the boundary line L1 that is not parallel to the X axis.

Figure 11:
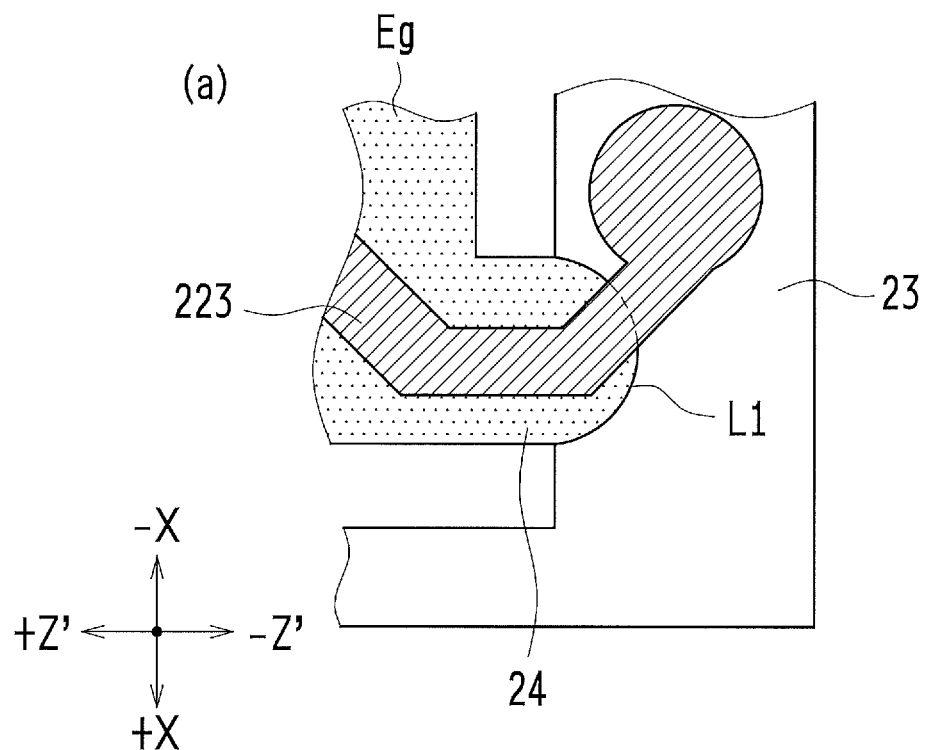
FIG. 11 are enlarged diagrams each illustrating part of the crystal resonator plate in the vicinity of the connecting part that connects the support part to the external frame part.
Figure 11:
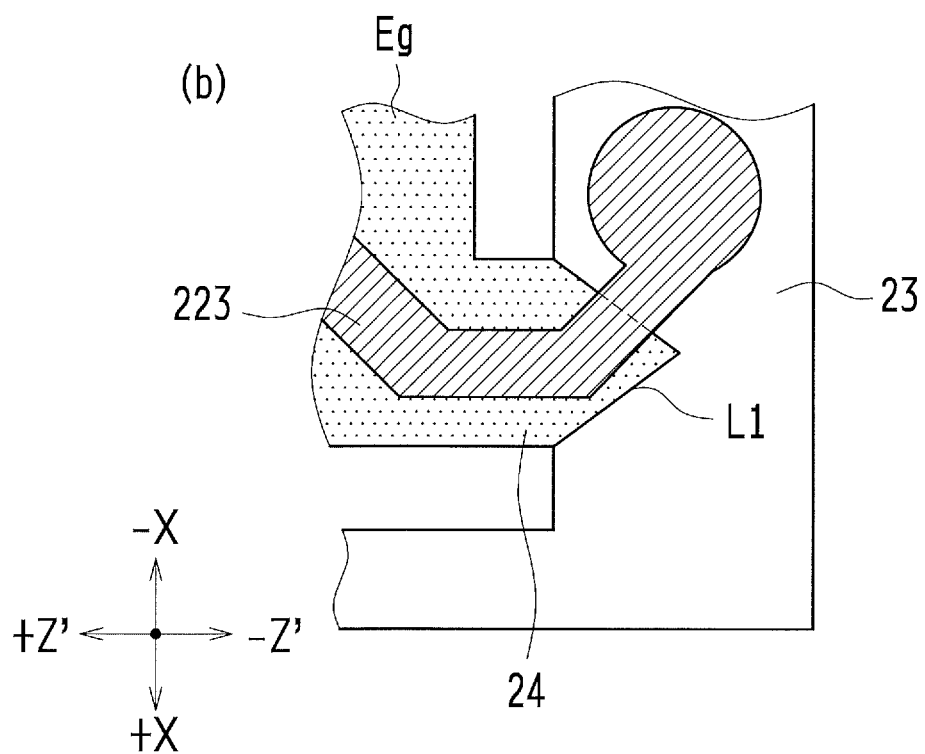

Also, the boundary line L1 that is not parallel to the X axis may have a curved shape (for example, an arc shape) in plan view as shown in FIG. 11 (*a*), or may have a shape formed by a straight line in plan view as shown in FIGS. 11 (*b*), 12 (*a*), 12 (*b*) and 13. However, the boundary line L1 as the straight line can form a further elongated gently stepped part. Thus, it is preferable to form at least part of the stepped part that is superimposed on the first lead-out wiring 223 as a straight line part so as to further effectively reduce disconnection or the like of the first lead-out wiring 223 on the stepped part.

Figure 12:
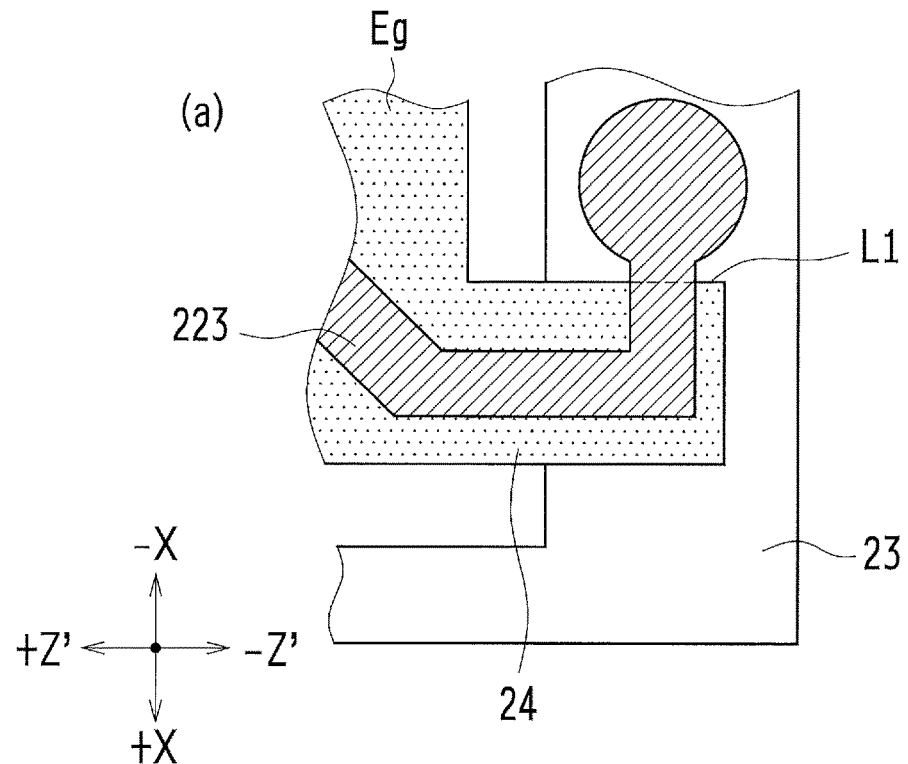
FIG. 12 are enlarged diagrams each illustrating part of the crystal resonator plate in the vicinity of the connecting part that connects the support part to the external frame part.
Figure 12:
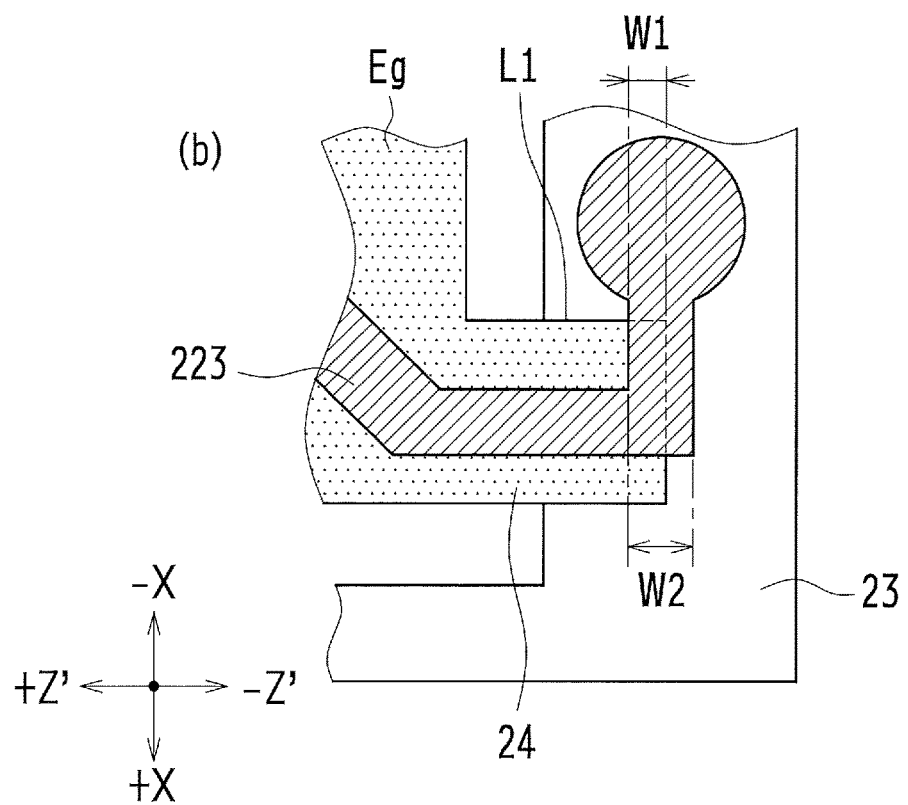

Also, when the boundary line L1 is formed as a straight line, it is preferable to form this straight line so as to orthogonally intersect with the X axis in plan view, as shown in FIGS. 12 (*a*) and 12 (*b*). This is because the stepped part becomes gentler as the boundary line L1 is formed so as to make an angle close to the right angle with the X axis in plan view, and the stepped part is the gentlest at the part where the boundary line L1 makes the right angle with the X axis. Therefore, it is possible to further effectively reduce disconnection or the like of the first lead-out wiring 223 by forming at least part of the stepped part that is superimposed on the first lead-out wiring 223 as a straight line that orthogonally intersects with the X axis.

When the straight line part is formed on the stepped part that is superimposed on the first lead-out wiring 223, the length W1 of the straight line part is preferably half or more the width W2 of the first lead-out wiring 223 (see FIG. 12 (*b*)). Furthermore, when the straight line part is formed on the stepped part that is superimposed on the first lead-out wiring 223, the length of the straight line part is more preferably not less than the width of the first lead-out wiring 223 (see FIGS. 11 (*b*) and 12 (*a*)). That is, as the length of the straight line part is larger relative to the width of the first lead-out wiring 223, disconnection or the like of the first lead-out wiring 223 can be further effectively reduced.

Figure 13:
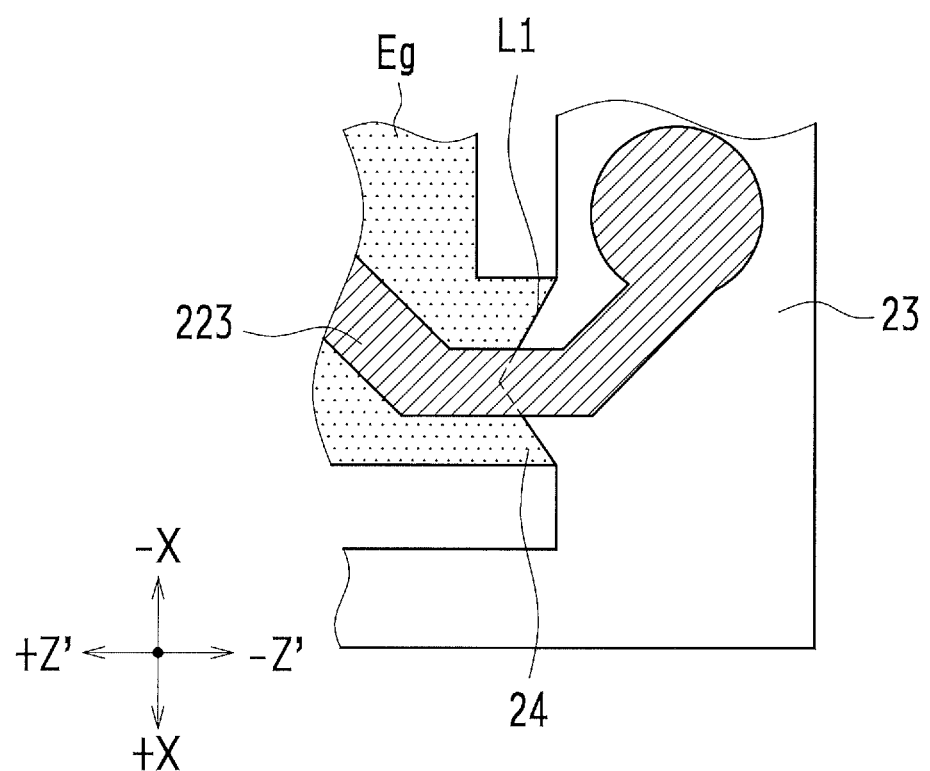
FIG. 13 is an enlarged diagram illustrating part of the crystal resonator plate in the vicinity of the connecting part that connects the support part to the external frame part, which schematically indicating a variation of the respective shapes of the etching region and the lead-out wiring in plan view.

In the examples indicated in FIGS. 10, 11 (*a*), 11 (*b*), 12 (*a*) and 12 (*b*), the boundary of the etching region Eg (i.e. the stepped part) is formed on the external frame part 23 side relative to the boundary between the support part 24 and the external frame part 23. The present invention is not limited thereto. As shown in FIG. 13, the boundary of the etching region Eg may be formed on the support part 24 side relative to the boundary between the support part 24 and the external frame part 23. However, when the stepped part is formed on the support part 24 side, the boundary of the stepped part in the +X direction is likely to have a cross-section with the caved shape. Thus, in order to avoid such a shape of the cross-section, it is preferable that the boundary of the etching region Eg is formed on the external frame part 23 side.

Also, when the boundary of the etching region Eg (i.e. the stepped part) is formed on the external frame part 23 side relative to the boundary between the support part 24 and the external frame part 23, the etching region Eg has an entering part that is formed so as to enter part of the external frame part 23. As shown in FIG. 10, a start point P of the entering part on the −X side can be formed within a connection area R between the support part 24 and the external frame part 23. With the above configuration, it is possible to reduce the area of the entering part and accordingly to sufficiently maintain a bonding area on the external frame part 23 to the sealing members (i.e. the first sealing member 3 and the second sealing member 4). Thus, it is possible to prevent degradation of the bonding strength and the sealing characteristics of the crystal resonator device (for example, the crystal oscillator 101).

In the case in which the entering part is formed in the external frame part 23, it was found, by the inventor of the present invention, that a recess is generated at the connecting part that connects the support part 24 to the external frame part 23 at the time of frequency adjustment etching under the condition that the start point P is formed on the extension line of the side of the support part 24 on the −X side. When such a recess is generated, the recess acts as a stress concentration point at the connecting part that connects the support part 24 to the external frame part 23, which leads to degradation of impact resistance of the crystal resonator device. With the configuration in which the start point P is formed within the connection area R between the support part 24 and the external frame part 23 as shown in FIG. 10, it is possible to avoid generation of the recess, which results in prevention of degradation of the impact resistance of the crystal resonator device.

Embodiment 2

In the many examples of the crystal resonator plate 2 shown in the first embodiment, the entering part is formed in the etching region so as to enter the external frame part 23 from the support part 24 when the frequency adjustment etching is performed, in order to prevent disconnection of the first lead-out wiring 223. Meanwhile, the inventor of the present invention found that when the entering part is formed in the etching region, a recess may be formed at a corner of the connecting part that connects the support part 24 to the external frame part 23 during the frequency adjustment etching depending on the shape of the entering part, which may generate degradation of the impact resistance to the falling and the like.

In this second embodiment, an example of the configuration will be described, with which vibration leakage from the vibrating part 24 can be reduced while preventing generation of the recess at the connecting part that connects the external frame part 23 to the support part 24 so as to reduce the degradation of the impact resistance due to the recess.

The main configuration of the crystal oscillator 101 according to the second embodiment is the same as the main configuration according to the first embodiment described with reference to FIGS. 1 to 7. Therefore, the main configuration of the crystal oscillator 101 is omitted here. The feature of the second embodiment is related to the shape of the entering part that is formed in the external frame part 23 of the crystal resonator plate 2 at the time of the frequency adjustment etching. Hereinafter, this feature is described in detail.

Figure 14:
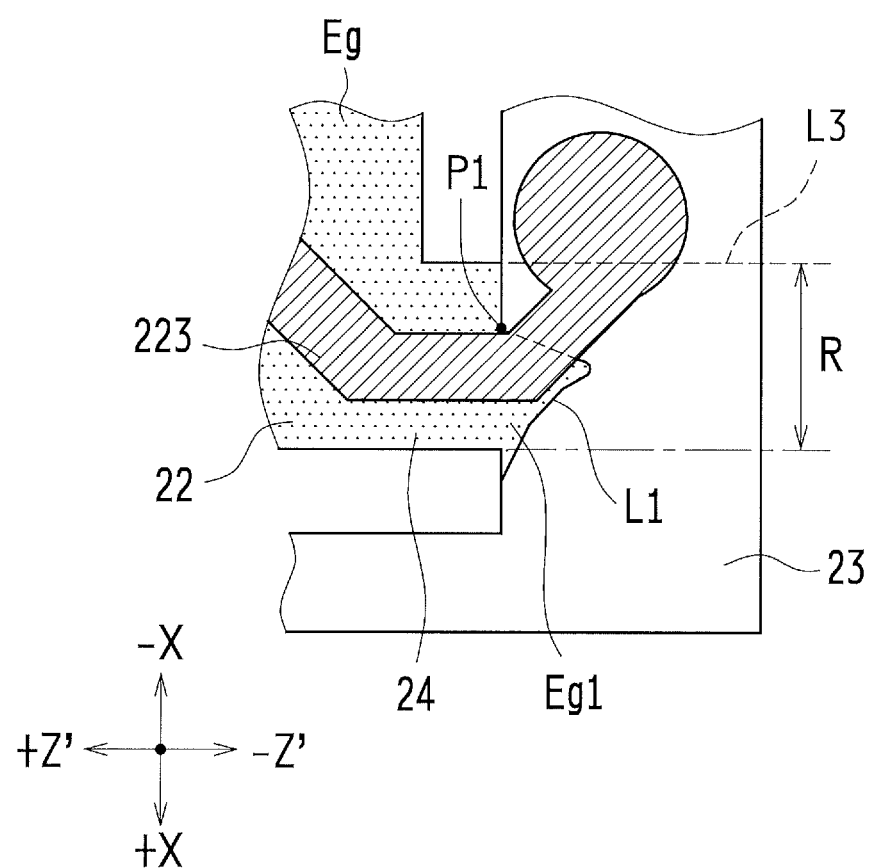
FIG. 14 is an enlarged diagram illustrating part of the crystal resonator plate in the vicinity of the connecting part that connects the support part to the external frame part, which schematically indicating a shape of an entering part of the etching region in plan view.

The crystal resonator plate 2 according to the second embodiment has a feature that the boundary shape of the etching region Eg is devised in order to prevent disconnection of the lead-out wiring extended from the excitation electrode and also to reduce degradation of the impact resistance of the connecting part that connects the external frame part 23 to the support part 24. On the first main surface 211 of the crystal resonator plate 2 of this second embodiment, to which a treatment for preventing disconnection is performed, the boundary of the etching region Eg is not matched with the boundary between the support part 24 and the external frame part 23, but the etching region Eg has an entering part Eg1 that is formed so as to enter the external frame part 23, as shown in FIG. 14. In this way, at least part of the boundary of the entering part Eg1 of the etching region Eg is a boundary line L1 that is not parallel to the X axis. In this case, the stepped part generated at the boundary line L1 is neither a stepped part having the vertical cross-section nor a stepped part having the caved shape, but is a gentle stepped part. Furthermore, the first lead-out wiring 223 on the first main surface 211 is formed so as to pass over at least part of the boundary line L1, which prevents disconnection or the like of the first lead-out wiring 223.

Figure 15:
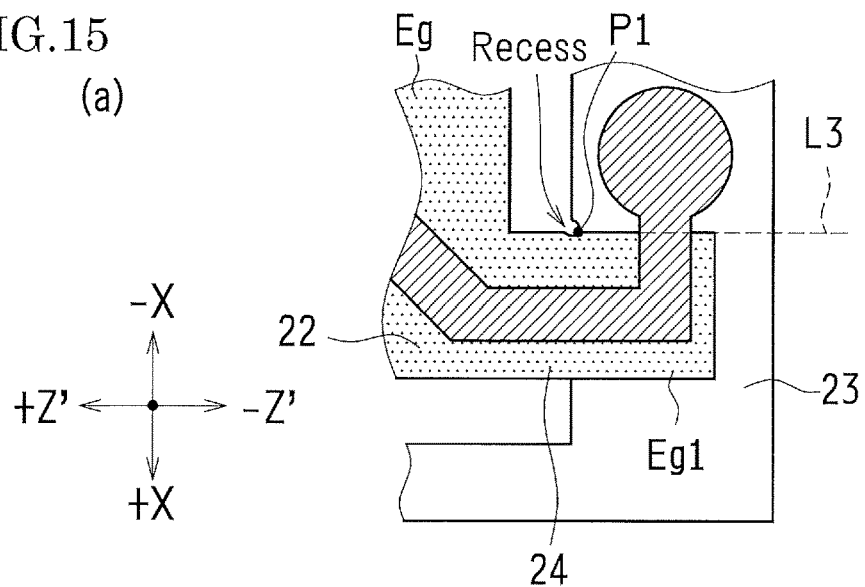
FIG. 15 are enlarged diagrams each illustrating part of the crystal resonator plate in the vicinity of the connecting part that connects the support part to the external frame part.
Figure 15:
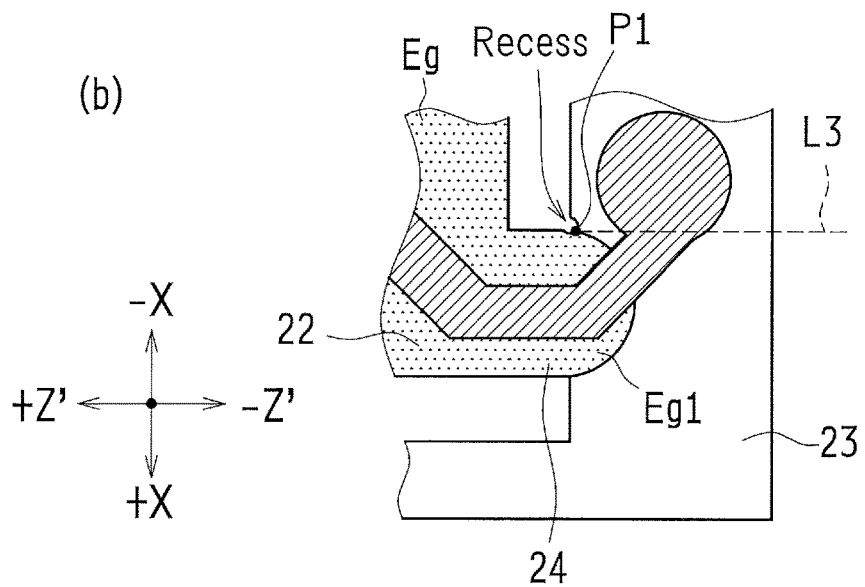
Figure 15:
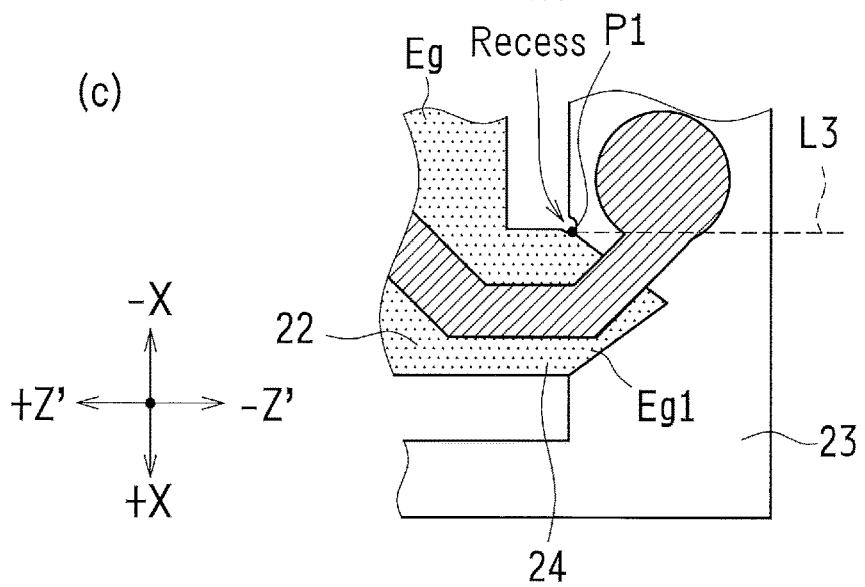

However, as shown in FIGS. 15 (a) to 15 (c), in the case in which a start point P1 on the one side (in particular, the start point on the −X side) of the boundary of the entering part Eg1 of the etching region is formed on an extension line L3 of the side of the support part 24 on the −X side, it was found, by the inventor of the present invention, that a recess is generated at the connecting part that connects the support part 24 to the external frame part 23 at the time of frequency adjustment etching. Specifically, the recess is generated at a corner of the support part 24 on the −X side and on the −Z' side. When such a recess is generated, the recess acts as a stress concentration point at the connecting part that connects the support part 24 to the external frame part 23, which leads to degradation of impact resistance of the crystal resonator device.

In order to avoid the formation of the recess, in the crystal resonator plate 2 shown in FIG. 14, the start point P1 of the boundary of the entering part Eg1 of the etching region is formed at a position shifted from the extension line L3 of the side of the support part 24 on the −X side. More specifically, the start point P1 is shifted from the extension line L3 toward the +X side so that the start point P1 is formed within the connection area R between the support part 24 and the external frame part 23.

In this way, since the start point P1 of the boundary of the entering part Eg1 of the etching region is formed at a position shifted from the extension line L3 of the side of the support part 24 on the −X side, it is possible to avoid generation of the recess at the connecting part that connects the support part 24 to the external frame part 23, which results in prevention of degradation of the impact resistance of the crystal resonator device.

Figure 16:
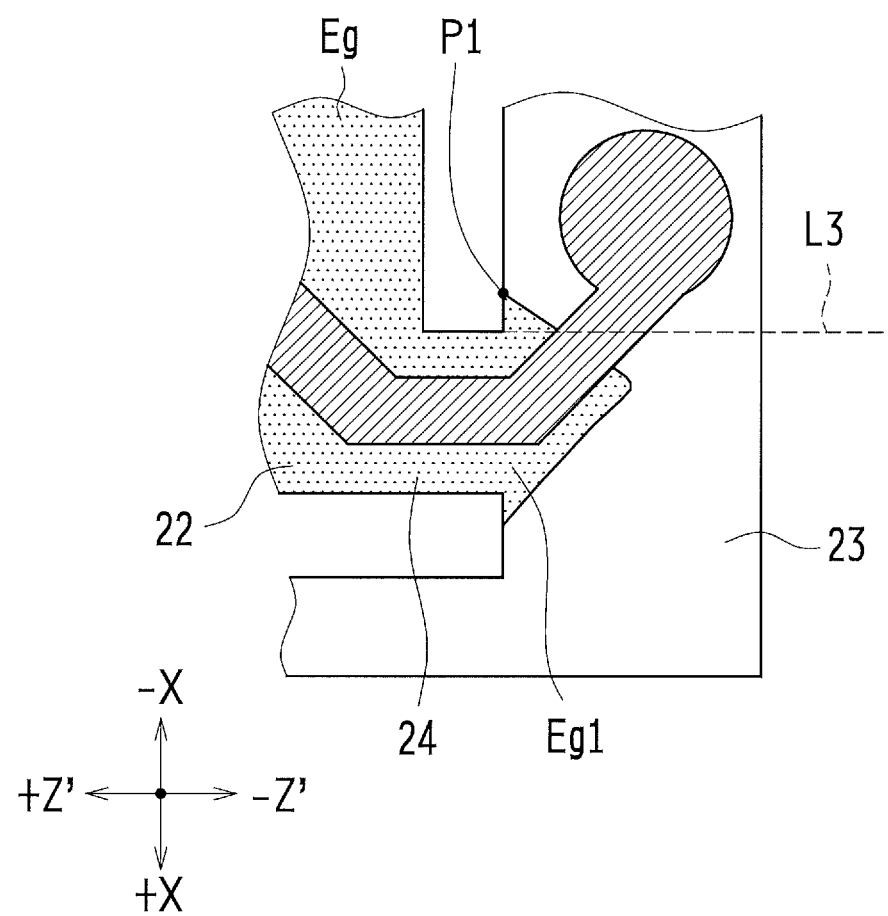
FIG. 16 is an enlarged diagram illustrating part of the crystal resonator plate in the vicinity of the connecting part that connects the support part to the external frame part, which indicates a variation of a shape of the entering part.

In the example shown in FIG. 14, the start point P1 is shifted from the extension line L3 toward the +X side. However, the present invention is not limited thereto. That is, as shown in FIG. 16, the start point P1 may be shifted from the extension line L3 toward the −X side. With such a configuration in which the start point P1 is shifted from the extension line L3 toward the −X side, it is also possible to avoid generation of the recess, which leads to prevention of degradation of the impact resistance of the crystal resonator device.

However, in the case in which the start point P1 is shifted from the extension line L3 toward the +X side as shown in FIG. 14, it is possible to reduce the area of the entering part Eg1 in the external frame part 23 and accordingly to sufficiently maintain a bonding area on the external frame part 23 to the sealing members (i.e. the first sealing member 3 and the second sealing member 4). Thus, it is possible to prevent degradation of the bonding strength and the sealing characteristics of the crystal resonator device (for example, the crystal oscillator 101). Also, since the entering part Eg1 as a thinner region is reduced, it is possible to improve the rigidity of the connecting part that connects the external frame part 23 to the support part 24.

Figure 17:
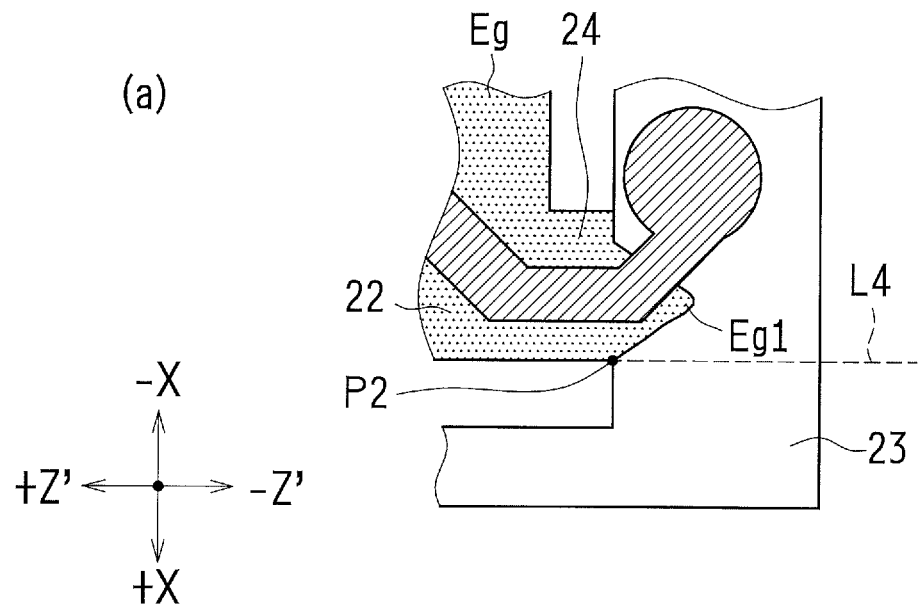
FIG. 17 are enlarged diagrams each illustrating part of the crystal resonator plate in the vicinity of the connecting part that connects the support part to the external frame part.
Figure 17:
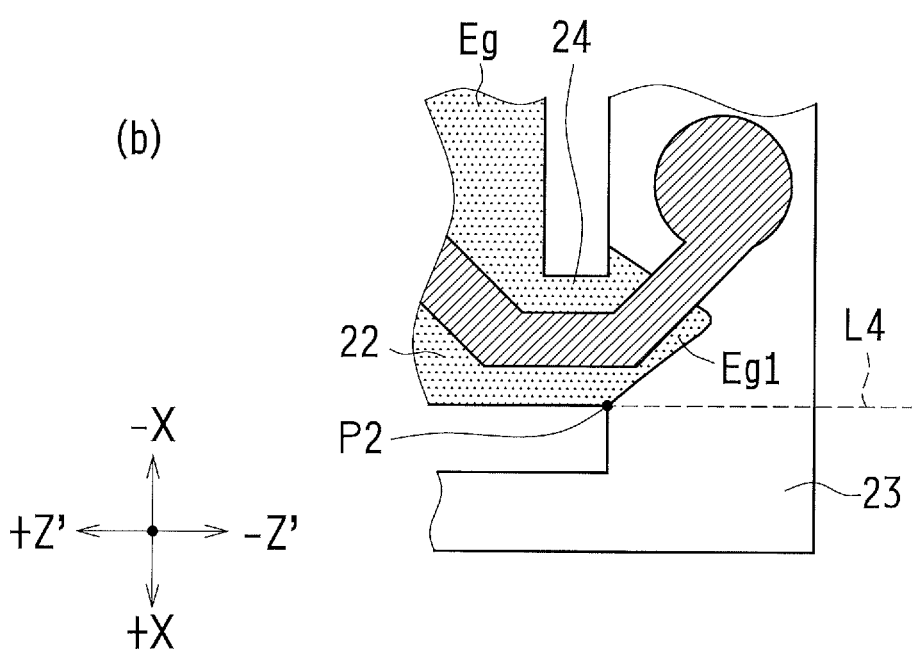

Also, the recess to be reduced in the present invention is generated only at a corner of the support part 24 on the −X side and on the −Z' side due to the crystal anisotropy of the crystal plate. Thus, a start point P2 on the other side (in particular, the start point on the +X side) of the boundary of the entering part Eg1 may be formed on an extension line L4 of the side of the support part 24 on the +X side, as shown in FIGS. 17 (*a*) and 17 (*b*).

Also, it is preferable that the entering part Eg1 of the etching region Eg is formed only on one main surface (here, on the first main surface 211) of the crystal plate. In this case, it is possible to avoid unnecessary reduction of the plate thickness caused by forming the entering part Eg1, which leads to prevention of reduction of rigidity of the crystal resonator plate 2.

The above-disclosed embodiments are to be considered in all respects as illustrative and not limiting. The technical scope of the invention is indicated by the appended claims rather than by the foregoing embodiments, and all modifications and changes that come within the meaning and range of equivalency of the claims are intended to be embraced therein.

DESCRIPTION OF REFERENCE NUMERALS

2 Crystal resonator plate
3 First sealing member
4 Second sealing member
205 IC chip
12 Package
22 Vibrating part
23 External frame part
24 Support part
101 Crystal oscillator (crystal resonator device)
211 First main surface
212 Second main surface
221 First excitation electrode
222 Second excitation electrode
223 First lead-out wiring
224 Second lead-out wiring
Eg Etching region
Eg1 Entering part
P1 Start point of boundary line of entering part on −X side
P2 Start point of boundary line of entering part on +X side
L1 Boundary line not parallel to X axis
L3 Extension line of side of support part on −X side
L4 Extension line of side of support part on +X side

The invention claimed is:

1. An AT-cut crystal resonator plate, comprising:
a substantially rectangular-shaped vibrating part including a first excitation electrode formed on a first main surface and a second excitation electrode formed on a second main surface;
a support part protruding from a corner of the vibrating part in a Z' axis direction of the AT-cut crystal resonator plate so as to support the vibrating part; and
an external frame part surrounding an outer periphery of the vibrating part and supporting the support part, wherein
a boundary between the support part and the external frame part is on a side parallel to an X axis out of inner peripheral sides of the external frame part,
the vibrating part and at least part of the support part are made as an etching region having a thickness thinner than a thickness of the external frame part, and a stepped part is generated in a vicinity of the boundary between the support part and the external frame part due to the etching region,
a lead-out wiring extended from each of the first excitation electrode and the second excitation electrode is formed over the support part to the external frame part so as to overlap with the stepped part, and
on at least one of the first main surface and the second main surface, an entirety of the stepped part is formed so as not to be parallel to the X axis in plan view such that the lead-out wiring passes over the stepped part with an entire width of the lead-out wiring overlapping with the stepped part in plan view.

2. The AT-cut crystal resonator plate according to claim 1, wherein
at least part of the stepped part that is superimposed on the lead-out wiring is formed as a straight line part that is not parallel to the X axis in plan view.

3. The AT-cut crystal resonator plate according to claim 2, wherein
the straight line part intersects orthogonally with the X axis in plan view.

4. The AT-cut crystal resonator plate according to claim 2, wherein
a length of the straight line part is half or more the entire width of the lead-out wiring.

5. The AT-cut crystal resonator plate according to claim 4, wherein
the length of the straight line part is not less than the entire width of the lead-out wiring.

6. The AT-cut crystal resonator plate according to claim 1, wherein
the stepped part is formed on the external frame part side relative to the boundary between the support part and the external frame part.

7. The AT-cut crystal resonator plate according to claim 1, wherein
on the at least one of the first main surface and the second main surface, the etching region has an entering part that is formed to enter part of the external frame part from the support part such that a boundary of the entering part of the etching region is the stepped part, and
a start point of the stepped part on a −X side is formed within a connection area between the support part and the external frame part.

8. The AT-cut crystal resonator plate according to claim 1, wherein
the vibrating part and the support part are made as the etching region having the thickness thinner than the thickness of the external frame part, and furthermore, on the at least one of the first main surface and the second main surface, the etching region has an entering part that is formed to enter part of the external frame part from the support part, and
a start point of a boundary of the entering part of the etching region is formed at a position shifted from an extension line of a side of the support part on a −X side.

9. The AT-cut crystal resonator plate according to claim 8, wherein
the start point of the boundary of the entering part of the etching region on the −X side is formed within a connection area between the support part and the external frame part.

10. A crystal resonator device comprising:
the crystal resonator plate according to claim 1;
a first sealing member covering the first main surface of the crystal resonator plate; and
a second sealing member covering the second main surface of the crystal resonator plate.

11. An AT-cut crystal resonator plate, comprising:
a substantially rectangular-shaped vibrating part including a first excitation electrode formed on a first main surface and a second excitation electrode formed on a second main surface;
a support part protruding from a corner of the vibrating part in a Z' axis direction of the AT-cut crystal resonator plate so as to support the vibrating part; and
an external frame part surrounding an outer periphery of the vibrating part and supporting the support part, wherein
the vibrating part and the support part are made as an etching region having a thickness thinner than a thickness of the external frame part, and
furthermore, on at least one of the first main surface and the second main surface, the etching region has an entering part that is formed to enter part of the external frame part from the support part,
a start point of a boundary of the entering part of the etching region is formed at a position shifted from an extension line of a side of the support part on a −X side, and
the start point of the boundary of the entering part of the etching region on the −X side is formed within a connection area between the support part and the external frame part.

12. The AT-cut crystal resonator plate according to claim 8, wherein
the entering part is formed on only one main surface out of the first main surface and the second main surface.

13. A crystal resonator device comprising:
the crystal resonator plate according to claim 11;
a first sealing member covering the first main surface of the crystal resonator plate; and
a second sealing member covering the second main surface of the crystal resonator plate.

14. An AT-cut crystal resonator plate, comprising:
a substantially rectangular-shaped vibrating part including a first excitation electrode formed on a first main surface and a second excitation electrode formed on a second main surface;
a support part protruding from a corner of the vibrating part in a Z' axis direction of the AT-cut crystal resonator plate so as to support the vibrating part; and
an external frame part surrounding an outer periphery of the vibrating part and supporting the support part, wherein
a boundary between the support part and the external frame part is on a side parallel to an X axis out of inner peripheral sides of the external frame part,
the vibrating part and at least part of the support part are made as an etching region having a thickness thinner than a thickness of the external frame part, and a stepped part is generated in a vicinity of the boundary between the support part and the external frame part due to the etching region,
a lead-out wiring extended from each of the first excitation electrode and the second excitation electrode is formed over the support part to the external frame part so as to overlap with the stepped part, and
on at least one of the first main surface and the second main surface, at least part of the stepped part that is superimposed on the lead-out wiring is formed so as not to be parallel to the X axis in plan view, wherein
on the at least one of the first main surface and the second main surface, the etching region has an entering part that is formed to enter part of the external frame part from the support part such that a boundary of the entering part of the etching region is the stepped part, and
a start point of the stepped part on a −X side is formed within a connection area between the support part and the external frame part.

15. An AT-cut crystal resonator plate, comprising:
a substantially rectangular-shaped vibrating part including a first excitation electrode formed on a first main surface and a second excitation electrode formed on a second main surface;
a support part protruding from a corner of the vibrating part in a Z' axis direction of the AT-cut crystal resonator plate so as to support the vibrating part; and
an external frame part surrounding an outer periphery of the vibrating part and supporting the support part, wherein
a boundary between the support part and the external frame part is on a side parallel to an X axis out of inner peripheral sides of the external frame part,
the vibrating part and at least part of the support part are made as an etching region having a thickness thinner than a thickness of the external frame part, and a stepped part is generated in a vicinity of the boundary between the support part and the external frame part due to the etching region,
a lead-out wiring extended from each of the first excitation electrode and the second excitation electrode is formed over the support part to the external frame part so as to overlap with the stepped part,
on at least one of the first main surface and the second main surface, at least part of the stepped part that is superimposed on the lead-out wiring includes plural straight line parts that are not parallel to the X axis in plan view, and
the lead-out wiring overlaps with the plural straight line parts in plan view.

16. An AT-cut crystal resonator plate, comprising:
a substantially rectangular-shaped vibrating part including a first excitation electrode formed on a first main surface and a second excitation electrode formed on a second main surface;
a support part protruding from a corner of the vibrating part in a Z' axis direction of the AT-cut crystal resonator plate so as to support the vibrating part; and
an external frame part surrounding an outer periphery of the vibrating part and supporting the support part, wherein
a boundary between the support part and the external frame part is on a side parallel to an X axis out of inner peripheral sides of the external frame part,
the vibrating part and at least part of the support part are made as an etching region having a thickness thinner than a thickness of the external frame part, and a stepped part is generated in a vicinity of the boundary between the support part and the external frame part due to the etching region,
a lead-out wiring extended from each of the first excitation electrode and the second excitation electrode is formed over the support part to the external frame part so as to overlap with the stepped part, on at least one of the first main surface and the second main surface, at least part of the stepped part that is superimposed on the lead-out wiring is formed so as not to be parallel to the X axis in plan view, the at least part of the stepped part that is superimposed on the lead-out wiring is formed as a straight line part that is not parallel to the X axis in plan view, and a length of the straight line part is not less than a width of the lead-out wiring.

\* \* \* \* \*